United States Patent
Ozawa

(10) Patent No.: US 6,721,039 B2
(45) Date of Patent: Apr. 13, 2004

(54) EXPOSURE METHOD, EXPOSURE APPARATUS AND DEVICE PRODUCING METHOD

(75) Inventor: Ken Ozawa, Atsugi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/757,489

(22) Filed: Jan. 11, 2001

(65) Prior Publication Data

US 2001/0035945 A1 Nov. 1, 2001

(30) Foreign Application Priority Data

Jan. 14, 2000 (JP) .................................... 2000-010207
Jun. 14, 2000 (JP) .................................... 2000-178982

(51) Int. Cl.$^7$ .......................... G03B 27/72; G03B 27/42
(52) U.S. Cl. .......................................... 355/69; 355/53
(58) Field of Search ........................ 355/53, 55, 67–71, 355/77; 356/399–401; 250/548, 492.2, 492.22

(56) References Cited

U.S. PATENT DOCUMENTS

| | | | |
|---|---|---|---|
| 4,687,322 A | | 8/1987 | Tanimoto et al. .............. 355/55 |
| 4,780,747 A | * | 10/1988 | Suzuki et al. .................. 355/68 |
| 4,801,977 A | | 1/1989 | Ishizaka et al. ................ 355/30 |
| 4,920,505 A | | 4/1990 | Suzuki ........................ 364/525 |
| 5,673,102 A | * | 9/1997 | Suzuki et al. .................. 355/53 |
| 5,864,433 A | | 1/1999 | Takahashi et al. ........... 359/637 |
| 5,892,573 A | * | 4/1999 | Takahashi ..................... 355/69 |
| 5,898,477 A | | 4/1999 | Yoshimura et al. ............ 355/53 |
| 5,925,887 A | * | 7/1999 | Sakai et al. .................. 250/548 |
| 5,965,308 A | | 10/1999 | Ozawa ......................... 430/30 |
| 6,278,516 B1 | * | 4/2001 | Miwa et al. ................... 355/67 |
| 6,414,743 B1 | | 7/2002 | Nishi et al. .................... 355/69 |

FOREIGN PATENT DOCUMENTS

| | | |
|---|---|---|
| EP | 1 014 197 A2 | 6/2000 |
| EP | 1 014 429 A1 | 6/2000 |
| JP | 5-343288 A | 12/1993 |
| JP | 2765422 A2 | 4/1998 |
| JP | 10-116766 | 5/1998 |
| WO | 99/05710 | 2/1999 |

* cited by examiner

Primary Examiner—Hung Henry Nguyen
(74) Attorney, Agent, or Firm—Oliff & Berridge PLC

(57) ABSTRACT

In an exposure method which illuminates a first object with an exposure beam and exposes a second object through a projection system with the exposure beam passing through a pattern of the first object, a correlation between a light amount of the exposure beam detected at a measuring point on an optical path to the first object and a light amount of the exposure beam on an image plane of the projection system is previously obtained, and when an integrated exposure amount with respect to the second object is controlled based on the light amount of the exposure beam detected at the measuring point and the correlation at the time of exposure of the second object, a variation amount of transmittance of the projection system is forecast in accordance with a process condition and exposure progression, and the correlation is renewed based on the forecast variation amount of the transmittance.

31 Claims, 8 Drawing Sheets

EXPOSURE METHOD, EXPOSURE APPARATUS AND DEVICE PRODUCING METHOD

BACKGROUND OF THE INVENTION

1. Field of the Invention

The present invention relates to an exposure method, an exposure apparatus and a device producing method, for example, to an exposure method, an exposure apparatus which are used in a lithography process for producing devices such as semiconductor devices, image pickup devices (CCDs etc.), liquid crystal display devices, plasma display devices, thin film magnetic heads, and to a device producing method using the exposure method. The invention is preferably used for controlling exposure amount using a scan exposure type projection exposure apparatus employing a step and scan system using an exposure beam from a pulse light source.

2. Description of the Related Art

Conventionally, as one of basic functions of the projection exposure apparatus used when semiconductor devices or the like are produced, there exists an exposure amount control function for keeping, within an appropriate range, an integrated exposure amount of each point in each shot region of a wafer (or glass plate or the like) as a substrate to be exposed on which photoresist (photosensitive material) is applied. As an exposure amount control in a conventional full field exposure apparatus such as a stepper, even if either of a continuous light source such as a mercury lamp and a pulse laser light source such as an excimer laser light source is used, a cut off control is basically carried out. In the cut off control, exposure is continued until an integrated value of exposure amount on a wafer which is indirectly measured through an integrator sensor comprising a photoelectric detector in an illumination optical system exceeds a predetermined critical level corresponding to a predetermined set exposure amount (target exposure amount). When the pulse laser light source is used as an exposure light source, since each pulse laser light has a variation in its energy, exposure is carried out using a plurality of pulse laser light having a predetermined number of minimum exposure pulses or greater, thereby obtaining a desired control and reproduction precision of exposure amount.

Further, in the scan exposure type projection exposure apparatus such as the step and scan type apparatus used in recent years, a system (open exposure amount control system) for controlling the exposure amount by simply integrating the light amount of each pulse of light as exposure light (exposure, beam) is used. Whereas, as disclosed in U.S. Pat. No. 5,627,627, there is proposed a system (pulse-by-pulse exposure amount control system) for controlling the energy of each pulse of light by measuring the integrated exposure amount with respect to a region included in a slit-shaped exposure region (illumination field) in a scanning direction on a wafer in a pulse-by-pulse manner in real time, and by individually calculating target energy of the next pulse of light based on the integrated exposure amount. In this pulse-by-pulse exposure amount control system, it is possible to reduce the variation in the integrated exposure amount as compared with the open exposure amount control system, and the pulse-by-pulse exposure amount control system can also be applied to the full field exposure type projection exposure apparatus.

By controlling the exposure amount with high precision in this manner, the size precision of pattern (resist pattern) of photosensitive material after development is enhanced, resolution that is more closer to threshold resolution determined in accordance with wavelength (exposure wavelength) of the exposure light, a numerical aperture of the projection optical system and the like can be obtained. The exposure wavelength itself has been further shortened in order to further enhance the threshold resolution, and in recent years, a tendency of using an Arf excimer laser (wavelength of 193 nm) as an exposure light source of the next generation of the KrF excimer laser (wavelength of 248 nm) is increasing.

Under the present circumstances, an optical material having a practical transmittance that can be used as glass material for a refraction member (such as lens) constituting the projection optical system is quartz glass (synthetic quartz) and fluorite. Since the fluorite is expensive, it is possible to reduce the producing cost of the projection optical system by using the quartz glass as much as possible.

However, since the excimer laser light is pulsed light, and if the optical material such as quartz glass is irradiated with the pulsed light of high energy in vacuum ultraviolet region, it is known that its transmittance is varied with time constant on the order of some tens seconds. This phenomenon is reversible to some degree, and if the radiation of pulsed light is stopped, the transmittance of the optical material is restored toward a direction of its initial value with a predetermined time constant. Therefore, when all shot regions on the wafer are sequentially exposed using the pulsed light, the transmittance of the projection optical system is gradually varied.

If the transmittance of the projection optical system is varied in this manner, the relation between the light amount of the exposure light detected by the above-mentioned integrator sensor and the light amount on an image plane of the projection optical system is varied. Therefore, if the exposure amount is controlled based on the relation measured before exposure (correlation between the integrator sensor and the image plane) and the detection result of the integrator sensor, an error is generated in the integrated exposure amount. For this reason, in the projection optical system using the ArF excimer laser light to obtain higher resolution, there is a problem that the target resolution can not be obtained.

Similarly, also when the transmittance variation is generated in an optical member from the integrator sensor to a reticle as a mask in the illumination optical system, the control precision of the exposure amount is lowered.

In this regard, it is known that the variation amount of the transmittance in the short term can be reduced by controlling the doped amount of hydrogen ion ($H^+$) in components included in the quartz glass. However, in such a quartz glass, deterioration (compaction) of characteristics due to irradiation of pulsed light over long term is increased. For this reason, although it is possible to use hydrogen ion amount controlled quartz glass where the quartz glass can easily be replaced as in the illumination optical system, but it is preferable not to use the hydrogen ion amount controlled quartz glass where it is difficult to replace the quartz glass, as in the projection optical system. As a result, since there is a tendency that quartz glass whose transmittance is varied in the short term is used especially in the projection optical system, it is desired to develop an exposure method and an exposure apparatus capable of obtaining high control precision of exposure amount even if the transmittance is varied.

When a reflectivity of a reflection member in the projection optical system comprising a catadioptric system for example is also varied in a short term in addition to the transmittance, it is necessary to appropriately control the exposure amount to cope with it.

SUMMARY OF THE INVENTION

In view of the above circumstances, it is a first object of the present invention to provide an exposure method capable of obtaining high control precision of exposure amount on an object to be exposed (such as wafer) even when an optical member whose transmittance or reflectivity is gradually varied is used in an optical system.

It is a second object of the present invention to provide an exposure method capable of obtaining high control precision of exposure amount on an object to be exposed even if the transmittance (the entire, transmittance including the reflectivity) of the optical system when the object is exposed with pulsed light.

Further, it is another object of the invention to provide an exposure apparatus capable of using the above exposure method and a producing method of a device using the above exposure method.

According to a first aspect of the present invention, there is provided an exposure method which illuminates a first object with an exposure beam and exposes a second object through a projection system with the exposure beam passing through a pattern of the first object, comprising:

with a correlation between a light amount of the exposure beam detected at a measuring point on an optical path to the first object and a light amount of the exposure beam on an image plane of the projection system being previously obtained, when an integrated exposure amount with respect to the second object is controlled based on the light amount of the exposure beam detected at the measuring point and the correlation at the time of exposure of the second object, forecasting a variation amount of transmittance of the projection system in accordance with a process condition and exposure progression, and renewing the correlation based on the forecast variation amount of the transmittance.

According to the exposure method of the first aspect, of the invention, a coefficient for obtaining the light amount on the image plane from the light amount at the measuring point for example is previously obtained as the correlation, and the variation ratio of the transmittance of the projection system is previously obtained as a function of the process condition and the exposure progression. Then, the variation amount of the transmittance is obtained during exposure based on the function, and the coefficient can be corrected by multiplying the coefficient by the transmittance after it was varied. By multiplying the measured value of the light amount at the measuring point by the corrected coefficient, the light amount of the exposure beam on the second object can be indirectly obtained, and the high exposure amount control precision can be obtained by controlling the exposure amount such that the integrated, exposure amount on the second object obtained by integrating the light amount becomes the target exposure amount (set exposure amount).

In this case, by correcting the coefficient using the average value of the spacial transmittance variation of the projection system, the error in the exposure amount in each sectioned region (shot region) on the second object can be divided with respect to the average value with small calculation amount and minimized.

Although the projection system is used as the optical system for forecasting the variation amount of the transmittance in the exposure method of the first aspect of the present invention, when an illumination system in which the first object is irradiated with the exposure beam is provided and the light amount of the exposure beam is detected at a predetermined measuring point in the illumination system, an optical member of a portion of the illumination system disposed between the measuring point and the first object and an optical system including the projection system are used as an optical system for forecasting the variation amount of the transmittance. That is, an optical member disposed on an optical path from the measuring point to the second object in the illumination system is the optical system for forecasting the variation amount of the transmittance.

As one example, a wavelength of the exposure beam is 200 to 170 nm, and the projection system includes a refraction member comprising quartz glass. The quartz glass has a tendency that its transmittance with respect to light (especially pulsed light of high output in vacuum ultraviolet region is varied in the short term, and the transmittance variation can mathematically be handled substantially correctly as a general linear system by cutting (variation) of Si—X bonding and recombination (relaxation) thereof. By forecasting and calculating the variation amount of the transmittance caused during the exposure in which the exposure beam is irradiated and the relaxation amount of the transmittance caused during step moving or replacing of the second object, the exposure amount can be controlled with high precision based on the forecast values. Therefore, the control method of forecasting the variation amount of the transmittance as in the present invention is especially effective.

As one example, the exposure beam is pulsed light, and the process condition is at least one of an illumination condition of the first object, a kind of the pattern on the first object, size (chip size) of the illumination region, on the first object, pulse energy density (fluence) of the exposure beam, and cumulative using period of material of the optical member constituting the projection system. The exposure progression is expressed by at least one item of data of emitting time of the exposure beam and non-emitting time of the exposure beam.

For example, if the pattern density is locally varied depending upon a kind of pattern on the first object, the transmittance distribution is varied due to variation in intensity distribution of the exposure beam passing through the projection system, and the uneven illumination is varied in the exposure region on the second object. In this case also, it is possible to obtain appropriate exposure amount in average by forecasting the unevenness in transmittance distribution in accordance with the kind of the pattern.

It is preferable to use a variation amount of the transmittance with respect to the illumination power of the exposure beam and a time constant of variation of the transmittance as control parameters for forecasting the variation amount of the transmittance of the projection system, and to independently hold the control parameters for each of the illumination conditions of the first object. If the control parameters (control constants) are independently held for each of the illumination conditions, it is possible to excellently correct the exposure amount under any illumination condition.

Next, according to a second aspect of the invention, in the exposure method of the first aspect of the invention, there is provided a second exposure method wherein when the non-emitting time of the exposure beam exceeds a predetermined time, the transmittance of the projection system is measured, the forecast value of the variation amount of the transmittance of the projection system is reset.

According to the exposure method of the second aspect of the present invention, when there exists a non-emitting time exists as compared with the stepwisely moving time of the second object, such as the time of replacement, alignment or the like of the second object, there is an adverse possibility that not only the relaxation caused by recombination of the above-described cut bonding, but also a physical phenomenon which is difficult to be forecast such as the adherence of a contaminant remaining in a space of optical path and in a chamber of the exposure apparatus to the optical system may bring about a variation of the transmittance which is not negligible and therefore, the precision of the forecasting of the transmittance may be deteriorated in some cases. When the forecasting precision of the transmittance is deteriorated, if the transmittance of the projection system is measured in real time for verification and the forecast value based on the forecasting control equation is reset to the initial value, the control precision of the exposure amount is enhanced.

If the transmittance of the projection system is measured after a long non-illumination time and measured result showing that the forecasting precision of the transmittance is deteriorated is obtained, dummy illumination after the non-illumination time may be carried out, and the contaminant adhered to the optical system may be cleaned with light.

Similarly, when exposure is continuously carried out under different illumination conditions such as a so-called double exposure in which each sectioned region (shot region) on the second object is exposed using two kinds of mask patterns under two kinds of illumination conditions, the forecasting precision is also deteriorated when an relaxation phenomenon caused by the immediately preceding different illumination condition and a variation phenomenon caused by an illumination condition from now on are mixed. In such a case, when it is judged that the deterioration of the forecasting precision exceeds a predetermined level, if the exposure is stopped to measure the transmittance in real time for verification and the forecasting control equation is reset, the control precision of the exposure amount is enhanced.

Further, when it is forecast that the control parameters (control constants) themselves will also be varied gradually by long-term illumination of exposure beam, it is preferable to make the parameters renewable constants which are to be renewed by periodically measuring the control parameters. With this method, it is possible to excellently correct the exposure amount for a long time.

It is preferable that whenever a predetermined time is elapsed, the transmittance distribution with respect to the exposure beam of the projection system is measured, and if the variation of the transmittance distribution exceeds a predetermined tolerance, the illumination of the exposure beam is stopped to alleviate the variation in the transmittance of the projection system, or the first object is removed to irradiate the entire illumination region with the exposure beam to alleviate the variation. If the variation in the transmittance distribution becomes excessively great, there is an adverse possibility that the uneven exposure amount on the second object may exceed the tolerance. In such a case, if the transmittance is uniformed, the exposure amount distribution is uniformed.

Next, according to a third aspect of the present invention, there is provided an exposure apparatus, comprising:

an exposure light source which generates an exposure beam;

an illumination system which irradiates a first object with the exposure beam;

a projection system which irradiates a second object with the exposure beam passing through a pattern of the first object;

a first detector which detects a light amount of the exposure beam at a measuring point in the illumination system;

a second detector which detects a light amount of the exposure beam on an image plane of the projection system;

an exposure amount control system which stores a correlation between an output of the first detector and an output of the second detector and controls an integrated exposure amount with respect to the second object based on the output of the first detector and the correlation; and a forecasting control system which forecasts a variation amount of the transmittance of the projection system in accordance with a process condition and an exposure progression and renews the correlation based on the forecast variation amount of the transmittance.

Using such an exposure apparatus, the exposure method of each of the first and second aspects of the present invention can be used. Although the variation amount of the transmittance of the projection system is forecast in the third aspect of the present invention, it is also possible to forecast the variation amount of the transmittance of the optical system (including a portion of a plurality of optical members constituting the illumination system and the projection system) from the measuring point in thee integrator sensor to the second object. Since the most of variation amount of the transmittance is ascribable to the variation amount of the projection system, the variation amount of the transmittance of the optical system from the measuring point to the second object can substantially be considered as the variation amount of the transmittance of the projection system. In this case also, when the variation amount of the transmittance of the optical member (a portion of the illumination system) disposed between the measuring point and the projection system is great, this variation amount is taken into consideration of course.

In this case, it is preferable that an illumination condition switching member which switches illumination conditions with respect to the first object is provided in the illumination system, and the forecasting control systems calculates the forecast value of the variation amount of the transmittance of the projection system in accordance with the illumination condition.

It is preferable that a third detector, which measures light amount distribution of the exposure beam at the image plane of the projection system, is provided, and this third detector measures the transmittance distribution of the projection system.

Next, according to a fourth aspect of the present invention, there is provide a device producing method, comprising: transferring a mask pattern onto a work piece using the exposure method of the first or second aspect of the present invention. According the device producing method of the fourth aspect of the present invention, since if the exposure is carried out while using a pattern of the first object as a pattern, for the device and using the second object as the work piece (a substrate of the like such as a wafer), the integrated exposure amount can be controlled with high precision and therefore, it is possible to mass-produce a device, of high precision which is excellent in line width precision.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

One example of one embodiment of the present invention will be explained with reference to the drawings below. In this example, the present invention is applied to a step and scan type projection exposure apparatus using an excimer laser light source of a pulse light source as an exposure light sources when an exposure amount is controlled.

Figure 1:
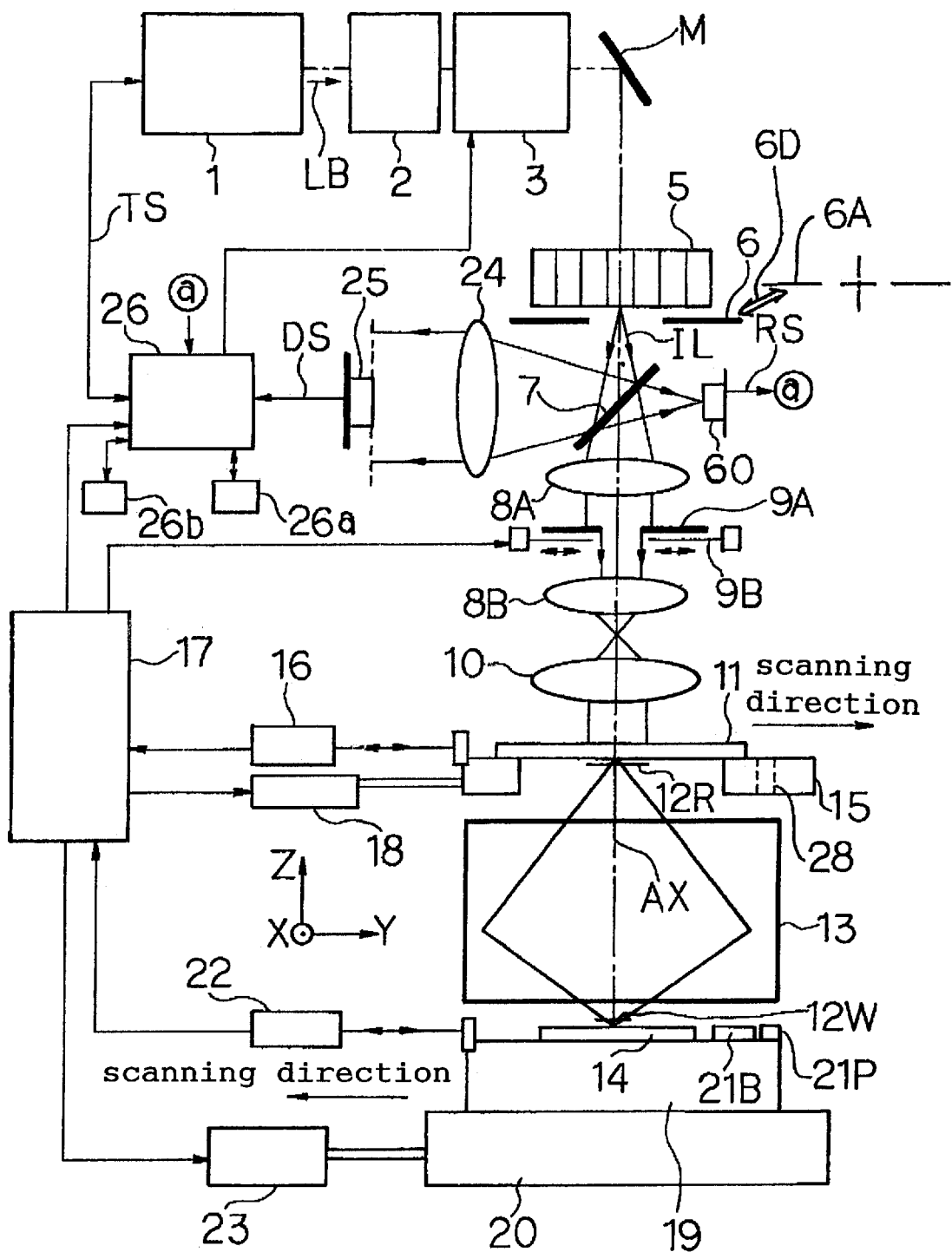
FIG. 1 is a block diagram showing a step and scan type projection exposure apparatus used in one example of one embodiment of the present invention.

FIG. 1 shows the projection exposure apparatus of the example. In FIG. 1, the cross sectional shape of a laser beam LB is shaped such that the laser beam LB as an exposure beam pulse-emitted from an excimer laser light source 1 as an exposure light source can efficiently enter a fly eye lens 5 as a succeeding optical integrator (uniformizer or homogenizer) by a beam shaping optical system 2 constituted by a cylinder lens, a beam expander and the like. In this example, an ArF excimer laser (wavelength of 193 nm) of a pulse light source in vacuum ultraviolet region having a wavelength equal to or less than 200 nm is used as the excimer laser light source 1. The present invention can be applied also when a pulse emitting type laser light source such as an $F_2$ laser (wavelength of 157 nm) or a $Kr_2$ laser, (wavelength of 146 nm) is used in place of the excimer laser light source. Further, the present invention can also be applied when a metal vapor laser light source or harmonics generating apparatus of a YAG laser is used as the exposure light source or when a laser light source for amplifying semiconductor laser using an optical fiber amplifier such as an erbium-doped fiber amplifier (EDFA) and then converting the wavelength is used as the exposure light source.

The laser beam LB emitted from the beam shaping optical system 2 enters an energy coarsely-adjuster 3 as a dimmer. The energy coarsely-adjuster 3 comprises two rotatable revolvers and a plurality of ND filters having different transmittance (=1-dimming rate) and respectively disposed on the revolvers. It is possible to switch the transmittance with respect to incident laser beam LB from 100% with a plurality of stages by rotating the revolvers with a driving motor. The energy coarsely-adjuster 3 may comprise a single revolver having a plurality of ND filters, or a single or a plurality of filter replacing-members having a plurality of mesh filters and the like having different transmittance.

In FIG. 1, the laser beam LB emitted from the energy coarsely-adjuster 3 enters the fly eye lens 5 as the optical integrator (uniformizer or homogenizer) through a mirror for bending an optical path. The fly eye lens 5 forms a large number of two dimensional light sources for illuminating a reticle 11 as a rear mask with a uniform illumination distribution. An aperture stop (so-called "σstop") 6 of an illumination system is disposed on an emitting plane of the fly eye lens 5. The aperture stop 6 is formed with a circular aperture for normal illumination. In this example, the aperture stop 6 can be replaced with an arbitrary aperture stop of any one of a zone illumination aperture stop 6A formed with a circular zone-like aperture, a deformation illumination aperture stop (not shown) formed with a plurality of eccentric apertures, a small coherence factor (σvalue) aperture stop (not shown) formed with a small aperture and the like by a driving apparatus 6D. It is possible to switch the illumination conditions with respect to the reticle 11 by switching the aperture stops 6, 6A and the like by the driving apparatus 6D.

If the aperture stop 6 for light shielding a central portion at the emitting side of the fly eye lens 5 is disposed, there is an adverse possibility that the total light amount of the laser beam is reduced and the illumination on the reticle is largely reduced. In this case, a circular zone-like luminous flux converting member having a conical refraction surface may be disposed between the optical passages of the excimer laser light source 1 and the fly eye lens 5 so as to convert the laser beam LB into the circular zone-like luminous flux without loosing light amount.

Laser beam ("pulsed illumination light IL" hereinafter) emitted from the large number of two dimensional light sources in the aperture of the aperture stop 6 enters the beam splitter 7 having small reflectivity and large transmittance. The pulsed illumination light IL as an exposure beam which has passed through the, beam splitter 7 passes through a rectangular aperture of a stationary illumination stop (stationary reticle blind) 9A through a first relay lens 8A. A movable illumination stop 9B having an aperture whose position and width corresponding to the scanning direction of the reticle 11 are variable is also disposed in the vicinity of the stationary illumination stop 9A. By further limiting the illumination field through the movable illumination stop 9B when the scanning exposure is started and completed, exposure of unnecessary portion is prevented. In this case, the movable illumination stop 9B is disposed on a plane which is conjugate with a pattern surface of the reticle, and the stationary illumination stop 9A is disposed on a position slightly defocused from the conjugation plane.

The pulsed illumination light IL as the exposure beam which has passed through the stationary illumination stop 9A and the movable illumination stop 9B further passes through a second relay lends 8B and a condenser lens 10 to illuminate a rectangular illumination region 12R on the reticle 11 held on the reticle stage 15 with uniform illumination distribution. An image which is reduced with projection magnification $M_{RW}$ ($M_{RW}$ is ¼, ⅕, ⅙ or the like, for example) through a projection optical system 13 in the illumination region 12R on the reticle 11 is projected and exposed onto the rectangular exposure region (illumination field) 12W on the wafer 14 as a substrate to be exposed on which the photoresist is applied. The wafer 14 is a disc-shaped substrate such as semiconductor (silicon or the like) or SOI (silicon on insulator) for example. The reticle 11 and the wafer 14 respectively correspond to the first object and the second object of the present invention, and the projection optical system 13 corresponds to a projection system of the present invention. In the following explanation, a Z-axis is in parallel to an optical axis AX of the projection optical system 13, a scanning direction (i.e., a direction parallel to a paper sheet of FIG. 1) of the reticle 11 with respect to the illumination region 12R in a plane perpendicular to the optical axis AX is defined as a Y-direction, and a non-scanning direction perpendicular to the scanning direction is defined as an X-direction.

At that time, the reticle stage 15 moves (scans) at equal speed on a reticle base (not shown) in the Y-direction by means of a linear motor type reticle stage driving section 18, and slightly moves in the X-direction, the Y-direction and the rotation direction such as to correct synchronous error. An X coordinate, a Y coordinate and a rotation angle measured by a moving mirror fixed to the reticle stage 15 and an external laser interferometer 16 are supplied to, a stage controller 17. Based on the supplied coordinates and the like, the stage controller 17 controls the position and speed of the reticle stage 15 through the reticle stage driving section 18. A measuring slit 28 (see FIG. 4) comprising an aperture which is elongated in the non-scanning direction (X-direction) is formed at a position offset in the scanning direction from the reticle 11 of the reticle stage 15. In this example, by moving the measuring slit 28 to the illumination region 12R as will be described later, the transmittance distribution of the projection optical system 13 is measured.

On the other hand, the wafer 14 is placed on a Z-tilt stage (sample stage) 19 through a wafer holder (not shown). The Z-tilt stage 19 is placed on an XY-stage 20. The XY-stage 20 stepwisely moves the wafer 14 in the X-direction and the Y-direction on the wafer base (not shown), and moves (scans) the wafer W in the Y-direction at equal speed. The Z-tilt stage 19 has a function of adjusting a position (focus position) of the wafer 14 in a Z-direction, and a function of adjusting the inclining angle of the wafer 14 with respect to the XY-plane. The X coordinate, the Y-coordinate and the rotation angle of the XY-stage 20 measured by the moving mirror fixed to the Z-tilt stage 19 and the external laser interferometer 22 are supplied to the stage controller 17. Based on the supplied coordinates and the like, the stage controller 17 controls the position and speed of the XY-stage 20 through a linear motor type wafer stage driving section 23. The wafer stage comprises the Z-tilt stage 19 and the XY-stage 20.

The operation of the stage controller 17 is controlled by a main control system which exercises control over the entire apparatus (not shown). At the time of scanning and exposure operation, the following two operations are repeated in a step and scan manner: an operation for moving the shot region to be exposed on the wafer 14 to a scan-starting position by stepwisely moving the XY-stage 20; and an operation for scanning the wafer 14 in a −Y-direction (or +Y-direction) with respect to an exposure region 12W at a speed. $M_{RW} \times V_R$ ($V_{RW}$ is a projection magnification from the reticle 11 to the wafer 14) through the XY-stage 20 in synchronization with a scanning operation of the reticle 11 at a speed VR in the +Y-direction (or −Y-direction) with respect to the illumination region 12R through the reticle stage 15. With this operation, reduced images of patterns of the reticle 11 are transferred onto all the shot regions on the wafer 14. The reason why the scanning directions of the reticle 11 and the wafer 14 are opposite from each other is that the projection optical system 13 projects reversely. When the projection optical system 13 projects an erect image, the scanning directions of the reticle 11 and the wafer 14 are the same.

An uneven illumination sensor 21P comprising a photoelectric converting device is permanently provided in the vicinity of the wafer 14 on the Z-tilt stage 19, a photoreceptive plane of the uneven illumination sensor 21P is set at the same height as the surface of the wafer 14, and a pin hole-like photoreceptor 21P$a$ (see FIG. 5) is formed. Further, an illumination amount monitor 21B comprising a photoelectric converting device formed with a photoreceptor 21B$a$ (see FIG. 5) which is wider than the exposure region 12W is permanently provided on the Z-tilt stage 19. The, illumination amount monitor 21B and the uneven illumination sensor 21P respectively correspond to a second detector and a third detector of the present invention.

Examples which can be used as the illumination amount monitor 21B and the uneven illumination sensor 21P are a photodiode or a photoelectric converting device such as a photomultiplier which are sensitive in the same wavelength region (e.g., wavelength of about 300 nm to 100 nm) as the pulsed illumination light IL, and which have high response frequency so as to detect the pulsed illumination light. Detection signals of the illumination amount monitor 21B and the uneven illumination sensor 21P are supplied to an exposure controller 26 through a peak hold circuit and an analogue/digital (A/D) converter (both not shown).

In FIG. 1, the pulsed illumination light IL emitted from the fly eye lens 5 and reflected by the beam splitter 7 as a measuring point is received by the integrator sensor 25 comprising a photoelectric converting device as the first detector. A photoelectric converting signal of the integrator sensor 25 is supplied to the exposure controller 26 as an output DS (digit) through the peak hold circuit and the A/D converter (both not shown). A correlation coefficient α1 between the output DS of the integrator sensor 25 and pulse energy (exposure amount) [mJ/cm$^2$] per unit area of the pulsed illumination light IL on the surface of the wafer 14 corresponding to the exposure region 12W (image plane) of the projection optical system 13 measured by the illumination amount monitor 21B is previously obtained. The correlation coefficient α1 is stored in a storage section 26$a$ such as a magnetic disc device connected to the exposure controller 26. When the transmittance of the projection optical system 13 is substantially constant, the correlation coefficient α1 obtained when the exposure step is started may be used as it is, but in this example, in order to control the exposure amount even when the transmittance of the projection optical system 13 is varied in the short term as will be described later, the correlation coefficient α1 is a variable (function of time).

The exposure controller 26 controls light emitting timing of the excimer laser light source 1, light emitting power and the like by supplying control information TS to the excimer laser light source 1 in synchronism with operation information of a stage system (reticle stage 15, wafer stages 19, 20) from the stage controller 17. The exposure controller 26 controls the transmittance by switching an ND filter of the energy coarsely-adjuster 3, and the stage controller 17 controls the opening and closing operation of the movable illumination stop 9B in synchronism with the operation information of the stage system.

A reflection amount monitor 60 is disposed on a position conjugate with a pupil plane of the illumination optical system on the side of the reflection surface of a back surface of the beam splitter 7. With this structure, the pulsed illumination light IL (reflected light) reflected by the wafer 14 returns to the beam splitter 7 from the projection optical system 13 through a second relay lens 8A, light reflected by the beam splitter 7 is received by the reflection amount monitor 60, and the detection signal, RS of the reflection amount monitor 60 is supplied to the exposure controller 26. During exposure, light amount (first light amount) entering the projection optical system 13 by the detection signal of the integrator sensor 25 is monitored, light amount (second light amount) reflected by the wafer 14 by the detection signal of the reflection amount monitor 60 and again passing through the projection optical system 13 is monitored. Therefore, by adding the first and second light amounts, the entire light amount passing through the projection optical system 13 can correctly be monitored.

Image forming characteristics of the projection optical system 13 such as distortion (including magnification error) and the best focus position are varied with time in accordance with the integration value of the entire light amount passing through the projection optical system 13. Thereupon, the relation between the integration value of the entire light amount and the variation amount of the image forming characteristics is previously stored in the storage section 26a, the exposure controller 26 obtains an integration value of the entire light amount passing through the projection optical system 13 from detection results of the integrator sensor 25 and the reflection amount monitor 60 during exposure, and the variation amount of the image forming characteristics of the projection optical system 13 is obtained from this integration value. For example, when there is an adverse possibility that the variation amount of the image forming characteristics exceeds a tolerance, the exposure controller 26 corrects the image forming characteristics of the projection optical system 13 through an image forming characteristics correcting apparatus (e.g., an apparatus for driving some lenses of the projection optical system 13) which is not shown, or corrects the focus position of the wafer 14 in accordance with a variation amount of the best focus position. With this operation, exposure is carried out always with optimal image forming characteristics.

Figure 2:
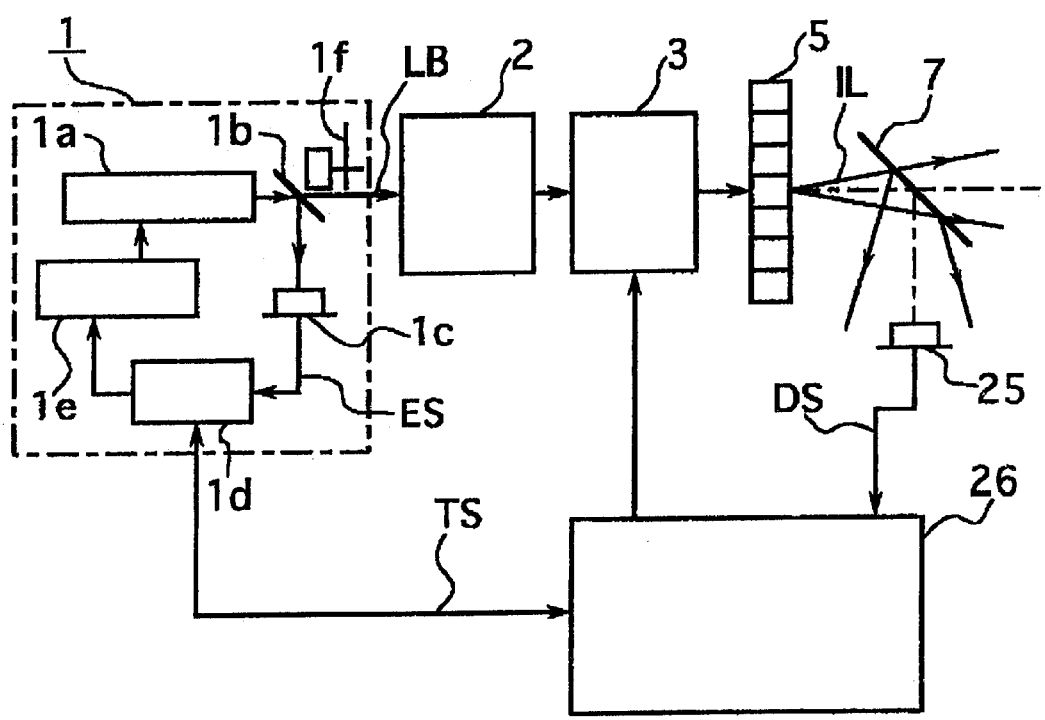
FIG. 2 is a block diagram showing an exposure amount control system of the projection exposure apparatus shown in FIG. 1.

A structure of the exposure amount control system of this example will be explained with reference to FIG. 2, FIG. 2 shows the exposure amount control system of the projection exposure apparatus shown in FIG. 1. In the excimer laser light source 1 shown in FIG. 2, laser beam emitted from a laser resonator 1a in pulse manner enters a beam splitter 1b having high transmittance and slight reflectivity. The laser beam LB passing through the beam splitter 1b is emitted outside. Laser beam reflected by the beam splitter 1b enters the energy monitor 1c comprising photoelectric conversion device enters the energy monitor 1c, and the photoelectric conversion signal from the energy monitor 1c is supplied to an energy controller 1d as output ES through a peak hold circuit (not shown). Unit of control amount of energy corresponding to the output ES of the energy monitor 1c is [mJ/pulse]. At the time of normal light emission, the energy controller 1d controls power source voltage in a high pressure power source 1e such that the output ES of the energy monitor 1c becomes a value corresponding to a target value of energy per one pulse in the control information ES supplied from the exposure controller 26, and energy per one pulse in the laser resonator 1a is determined in accordance with the power source voltage. With this, the average pulse energy of the laser beam LB emitted from the excimer laser light source 1 becomes a value required by the exposure controller 26.

Energy per one pulse of the excimer laser light source 1 is normally stabilized at a predetermined center energy E0, and the energy can be varied (continuously adjusted slightly) up and down from the center energy E0 within a predetermined range. A shutter if for shielding the laser beam LB in accordance with the control information from the exposure controller 26 is also disposed outside the beam splitter 1b in the excimer laser light source 1.

Further, in, FIG. 2, when the correlation coefficient which will be described later is calculated or renewed, the processing amount corresponding to the output ES of the energy monitor 1c is supplied to the exposure controller 26 through the energy controller 1d. The exposure controller 26 obtains the correlation between the processing amount corresponding to the output ES of the energy monitor 1c and the output DS of the integrator sensor 25. At the time of scanning and exposure, the exposure controller 26 sends the predetermined control information TS to the energy controller 1d and allows the excimer laser light source 1 to emit pulsed light substantially at constant cycle. The exposure controller 26 integrates the output DS from the integrator sensor 25 every illumination light pulse, and indirectly obtains the actual integrated exposure amount at each point on the wafer 14 sequentially. The exposure controller 26 adjusts the transmittance in the energy coarsely-adjuster 3 and finely adjusts the energy per one pulse in the excimer laser, light source 1 such that integrated exposure amount when each of the points passed through the exposure region 12W coincides with the set exposure amount (target exposure amount) with respect to the photoresist on the wafer 14 within a predetermined tolerance (precision).

An image forming system comprising a plurality of lenses made of quartz glass ($SiO_2$) as a refraction member and a single or a plurality of lenses made of fluorite ($CaF_2$) for correcting chromatic aberration is used as the projection optical system 13 of the present example shown in FIG. 1. At that time, since the fluorite is expensive, the usage amount of the fluorite is suppressed to the minimum. A material in which the variation of transmittance in the short term is allowed and transmittance variation amount (compaction) in the long term is reduced is used as the quartz glass instead of a material in which the doped amount of hydrogen ion ($H^+$) is controlled to reduce the variation in transmittance in the short term. This is because it is not easy to replace the optical member in the projection optical system 13.

The quartz glass or fluorite if necessary is used as refraction members (such as lenses) in the illumination optical system including the optical members from the beam splitter 7 to the condenser lens 10, but since it is easy to replace the refraction member in the illumination optical system, the material (material of which the transmittance is gradually varied in the long term) in which the doped amount of hydrogen ion (He$^+$) is controlled to reduce the variation in transmittance in short term is used for the quartz glass. The number of optical members of the illumination optical system from the beam splitter 7 (measuring point) to the condenser lens 10 is smaller than the number of optical members of the projection optical system 13. Therefore, the variation of the transmittance of the illumination optical system in the short term is not important.

In the quartz glass used in the projection optical system 13, it is known that bonding (Si—X) between silicon atom (Si) and atom or ion around it (oxygen (O), silicon (Si,) or the like, hereinafter represented by "X") is cut by the radiation of strong pulsed light in vacuum ultraviolet region, and its transmittance is varied in the short term (e.g., lowered), and if the radiation of pulsed light is stopped, the bonding (Si—X) is again recombined, and the transmittance is gradually restored by relaxation phenomenon in the short term.

Figure 3A:
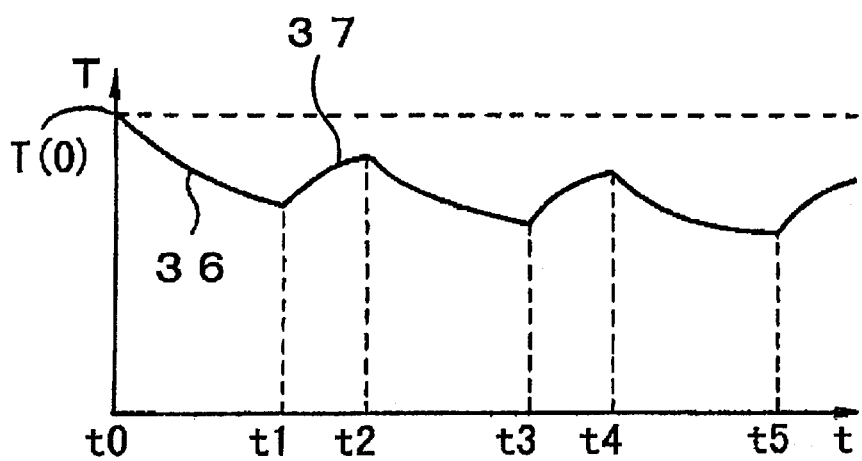
FIG. 3A is a graph showing one example of variation in transmittance of an optical system from a beam splitter 7 to a wafer 14 shown in FIG. 1.

Therefore, as shown in FIG. 3A, if it is assumed that the series of shot regions are exposed (irradiated with exposure light) at time intervals t0 to t1, t2 to t3, t4 to t5, . . . , and step movement (interruption of radiation) is carried out at time intervals therebetween, i.e., time intervals t1 to t2, t3 to t4, . . . ., and if the transmittance of the optical systems of the present example from the beam splitter 7 to the wafer 14 is defined as T, since the most of variation amount of the transmittance T is originated in variation in transmittance of the projection optical system, 13, the transmittance T of the optical system can be assumed as the transmittance of the projection optical system of the present invention. The transmittance T (initial value is set to T(0)) of the optical system (mainly the projection optical system 13) is reduced exponentially as shown with a curve 36 during radiation of the exposure light, and when the radiation is stopped, the transmittance T is increased exponentially as shown with a curve 37. In this example, time constant τa and variation ratio Ca of the curves 36 and 37 are previously obtained, and at the time "t" during exposure, the variation ratio δT(t) at time "t" of the transmittance T of the optical system is calculated in a computing section 26b connected to the exposure controller 26 shown in FIG. 1, and based on this, the exposure controller 26 controls the exposure amount.

The refraction material of the illumination optical system in FIG. 1 from the beam splitter 7 to the condenser lens 10 having small transmittance variation in the long term may be used, although the transmittance may be varied in the short term. In this case also, the transmittance T of the optical system from the beam splitter 7 to the wafer 14 is calculated. A value obtained by multiplying the transmittance T by a coefficient for unit conversion becomes the above correlation coefficient α1.

Figure 3B:
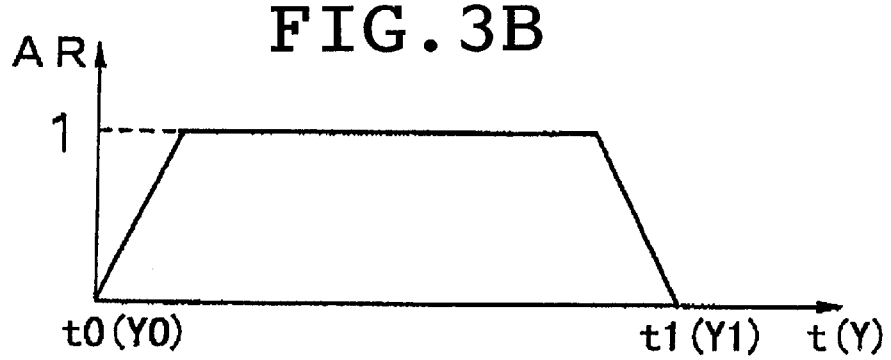
FIG. 3B is a graph showing one example of variation in aperture rate of a movable illumination field stop 9B shown in FIG. 1.

When the above-mentioned variation ratio δT(t) of the transmittance rate is calculated, the aperture rate AR determined by the movable illumination stop 9B shown in FIG. 1 is required, but as shown in FIG. 3B, the aperture rate AR is varied in a trapezoidal shape between 0 to 1 (100%) during the time interval of t0 to t1 during which one shot region is exposed (irradiated with exposure light). In this case, if it is assumed that the movable illumination stop 9B is opened and closed when the reticle stage 15 is located between a position Y0 and a position Y1 in the scanning direction (Y-direction), the aperture rate AR of the movable illumination stop 9B can be considered as being a function of the position Y in the scanning direction.

Next, one example of the exposure amount control operation by the projection exposure apparatus of the present example will be explained in detail with reference to flowcharts in FIGS. 10 and 11. First, with respect to the wafer 14 to be exposed in this example, a target exposure amount (target value of the integrated exposure energy) is set to a predetermined set exposure amount S0 in accordance with a photoresist to be used, and stored in an exposure data file of a host computer (not shown).

Figure 7:
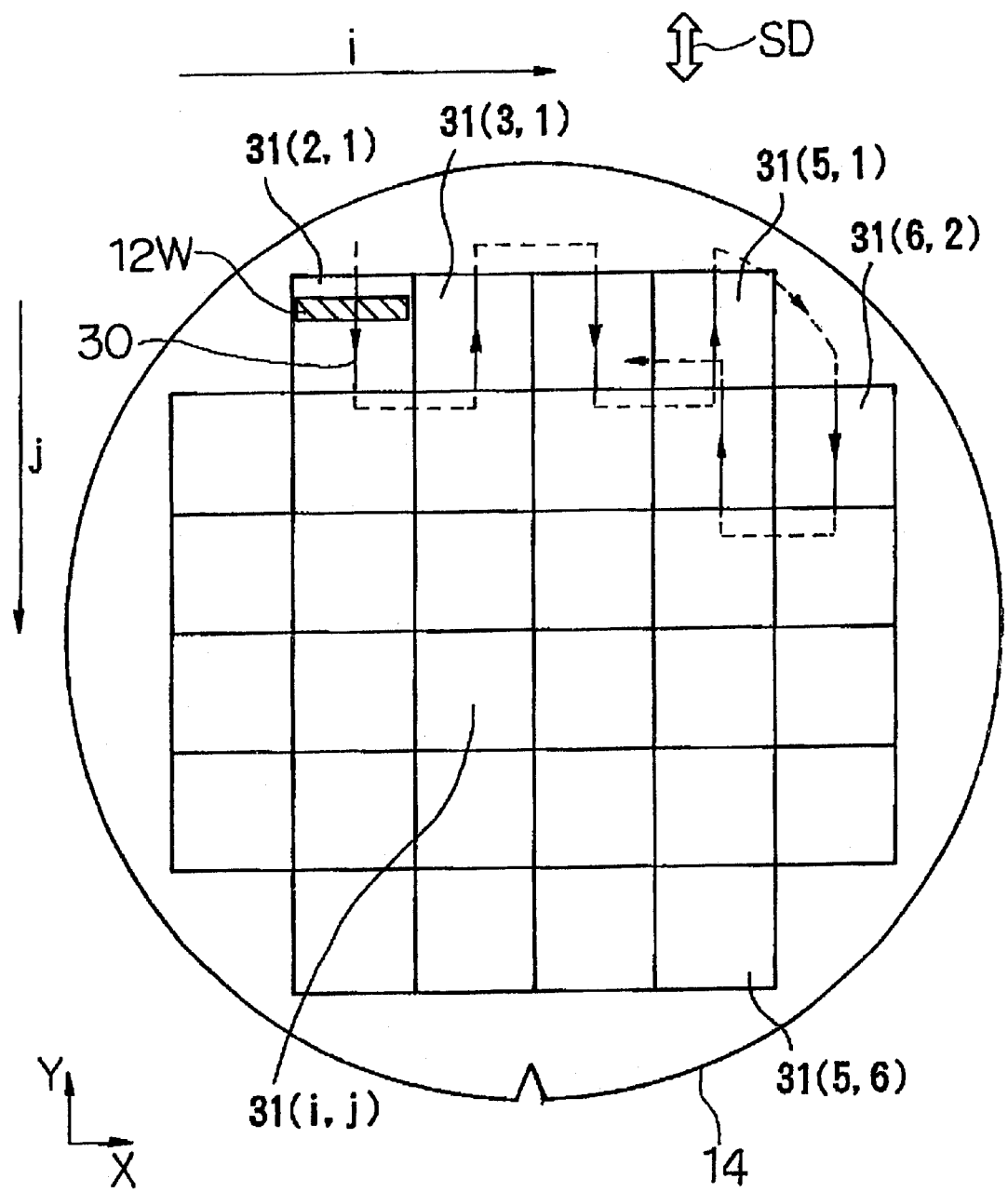
FIG. 7 is a plan view showing a shot map which is to be exposed in the one embodiment.

FIG. 7 shows the wafer 14 to be exposed. In FIG. 7, a region of a surface of the wafer 14 to be exposed is divided into shot regions as a plurality of rectangular sectioned regions each having predetermined pitches respectively in the X-direction and Y-direction. A shot region at a position (i, j) that is the i-th in the X-direction (i=1 to 6) and the j-th in the Y-direction (j–1 to 6) is expressed as a shot region 31 (i, j).

Figure 10:
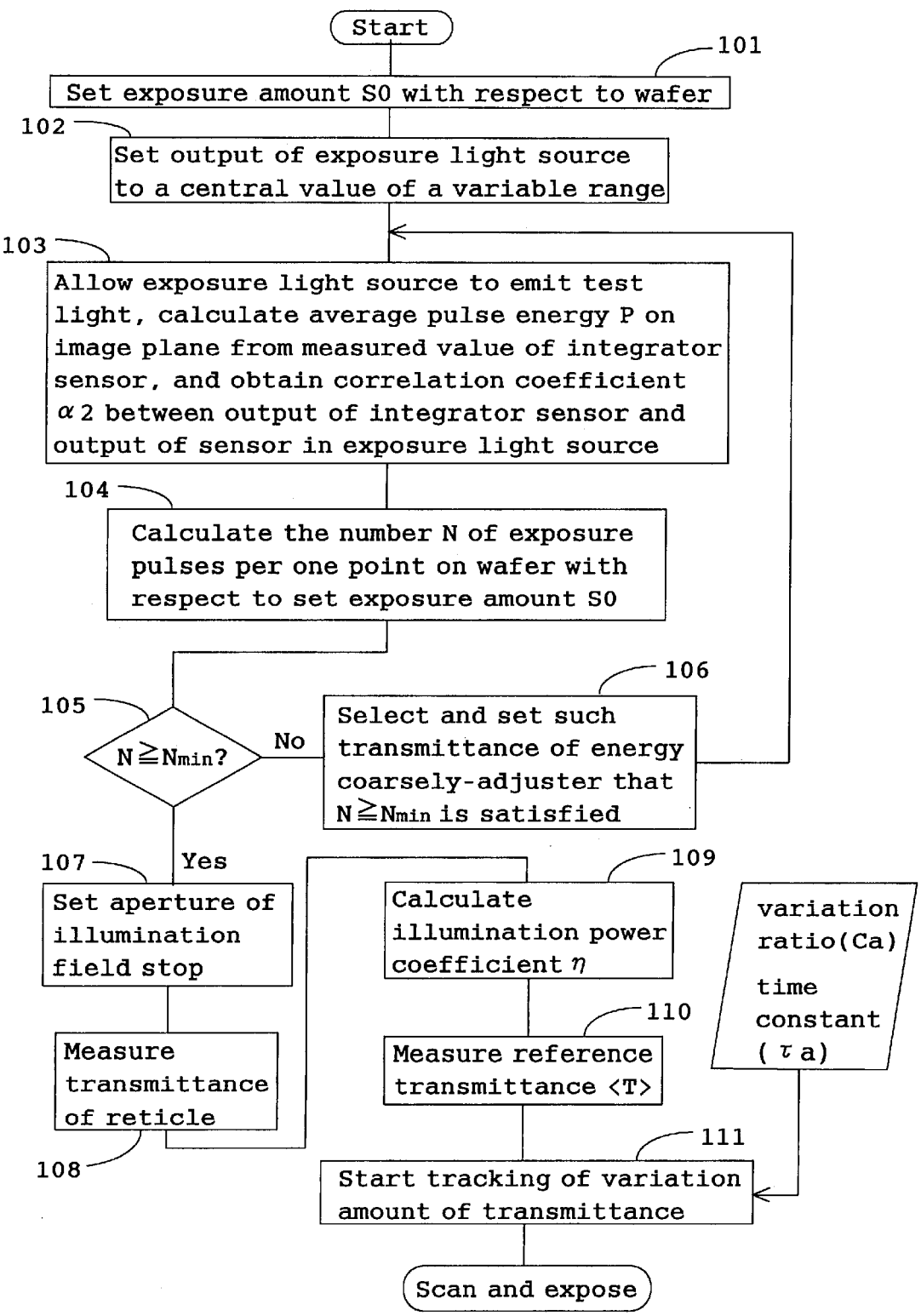
FIG. 10 is a flowchart showing a pre-treatment of a scanning exposure in one example of the one embodiment.

In step 101 in FIG. 10, an operator of the projection exposure apparatus of this example reads out data of the set exposure amount S0 with respect to the wafer from the exposure data file of the host computer, and stores the same in the storage section 26a of the exposure controller 26.

In next step 102, in a state in which the transmittance of the energy coarsely-adjuster 3 shown in FIG. 1 is set to 100% and a wafer to be exposed is not placed on the Z-tilt stage 19, the exposure controller 26 sets the output (pulse energy) of the excimer laser light source 1 as the exposure light source to a central value $E_0$ (neutral value) in a variable range, and sets the aperture rate AR of the movable illumination stop 9B to 1 (100%) through the stage controller 17.

Next, in step 103, the exposure controller 26 allows the excimer laser light source 1 to carry out the test light emission of some tens pulses for example, and takes in the output DS [digit] of the integrator sensor 25 every pulse of light. The average pulse energy P [mJ/cm$^2$] on an image plane (wafer surface) of the projection optical system 13 is calculated from the output DS and the correlation coefficient α1 using the following equation:

$$P = \alpha 1 \cdot DS \tag{1}$$

At that time, the exposure controller 26 takes in the output ES [mJ /pulse] of the energy monitor 1a as a sensor in the excimer laser light source 1 every pulse of light as shown in FIG. 2, and calculates a correlation coefficient α2 (α2=ES/DS) for converting the output DS of the integrator sensor 25 into an output ES of the energy monitor 1c. This correlation coefficient α2 is also stored in the storage section 26a. In this example, this correlation coefficient α2 is calculated by the test light emission whenever the transmittance of the energy coarsely-adjuster 3 is switched.

Figure 8A:
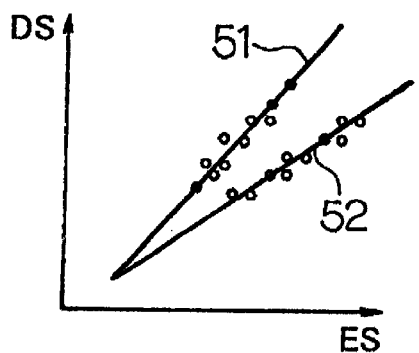
FIG. 8A is a graph showing one example of correlation data between a processing amount of an integrator sensor 25 and a processing amount of an energy monitor 1c.

At that time, since there are variations in energies of the pulsed light, measured data of the outputs ES and DS are distributed along a straight line 51 shown in FIG. 8A. A reciprocal of inclination of the straight line 51 obtained by the method of least squares, or average value of the correlation coefficient α2 calculated every pulse of light is finally defined as the correlation coefficient α2.

Using this correlation coefficient α2, the exposure controller 26 can calculate the output ES of the energy monitor 1c from the output DS of the integrator sensor 25 in accordance with the following equation:

$$ES = \alpha 2 \cdot DS \tag{2}$$

Therefore, it is possible to control the output of the excimer laser light source 1 using the output DS of the integrator sensor 25 as a reference.

Next, in step 104, the exposure controller 26 shows in FIG. 1 calculates the number N of exposure pulses per one point on the wafer with respect to the set exposure amount S0. That is, if a function round (x) is defined as a function which rounds off a variable "x" to the nearest integer, N can be expressed as follows:

$$N = \text{round}(S0/P) \quad (3)$$

Next, in step 105, it is judged whether the number N of the exposure pulses is equal to or greater than the minimum number $N_{min}$ of the exposure pulses which was previously determined to obtain the required exposure amount control reproduction precision $A_E$.

When $N<N_{min}$, it is necessary to increase the number N of exposure pulses. In order to increase the number N, it is necessary to decrease the average pulse energy P on the image plane following this equation (3). To that end, the flow proceeds to step 106, the exposure controller 26 selects the greatest value of the plurality of steps of transmittance that can be set by the energy coarsely-adjuster 3 shown in FIG. 1 within a range where $N \geq N_{min}$ is established, and the transmittance of the energy coarsely-adjuster 3 is set to that value. Thereafter, the flow proceeds to step 103 again, and the operations from steps 103 to 105 are repeated.

As a result, the average pulse energy P on the image plane under the transmittance after the renewal of the energy coarsely-adjuster 3 and the correlation coefficient α2 for converting the output DS of the integrator sensor 25 into the output ES of the energy monitor 1c using the equation (2) are renewed. In this case, since the transmittance of the energy coarsely-adjuster 3 is small, the relation between the output DS of the integrator sensor 25 and the output ES of the energy monitor 1c is like the measuring data along the straight line 52 shown in FIG. 8A, and the correlation coefficient α2 becomes great. That is, the correlation coefficient α2 is a function of the transmittance of the energy coarsely-adjuster 3. When $N \geq N_{min}$ is established at the step 105, the exposure controller 26 obtains a set value PT of energy (value converted into the measuring value on the image plane) per one pulse of the excimer laser light source 1 with respect to the set exposure amount S0 using the following equation:

$$Pt = S0/N \quad (4)$$

If the correlation coefficients α1 and α2 are used, the set value Pt can be converted into the output DS (=Pt/α1) of the integrator sensor t25, and the output DS of the integrator sensor 25 can be converted into an output (Et) of the energy monitor 1c in the excimer laser light source 1 as in the following manner:

$$Et = (\alpha 2 / \alpha 1) Pt \quad (5)$$

Next, the follow proceeds to step 107, the operator inputs size of the illumination region 12R on the reticle defined by the stationary illumination stop 9A shown in FIG. 1, and by extension size of the exposure region 12W on the wafer 14, into the exposure controller 26. As the size of the exposure region 12W, a width Ws in the scanning direction (Y-direction) and a width Wh in the non-scanning direction (X-direction) are input. Further, a width 2×XS in the X-direction and a width YS in the Y-direction of each shot region (each chip) on the wafer to be exposed are also input into the exposure controller 26. The size of the aperture of the stationary illumination stop 9A is set with respect to the exposure region 12W. In this case, Wh=2×XS is established. If the center (optical axis AX) of the exposure region 12W is defined as a point of origin in the X-direction, a lower limit of the, exposure region 12W in the X-direction is –XS, and an upper limit thereof is +XS.

Figure 3C:
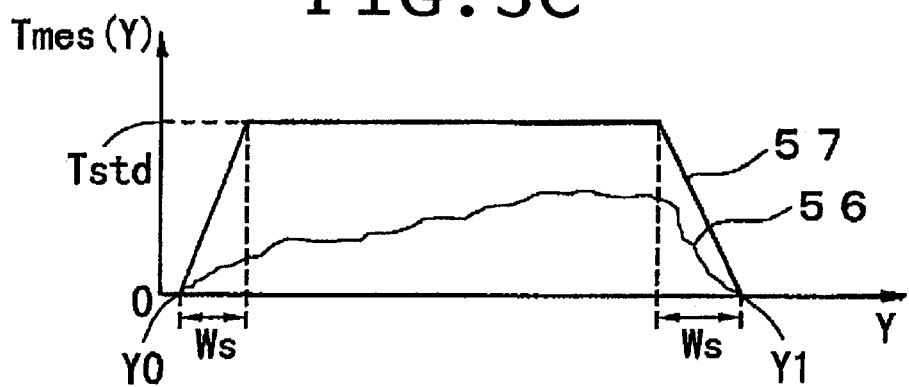
FIG. 3C is a graph showing a function Tmes (Y)

Next, in order to measure the transmittance of the reticle 11, the flow proceeds to step 108, and in FIG. 1, the XY-stage 20 is driven to accommodate the entire exposure region 12W within the photoreceptor of the illumination amount monitor 21B. In a state in which the reticle 11 is removed from the reticle stage 15, a detection signal $P_{RF}$ of the illumination amount monitor 21B and a detection signal DS of the integrator sensor 25 are taken in, and as a ratio value thereof, a reference transmittance Tstd (=$P_{RF}$/DS) when there is no reticle is obtained, and the result is stored in the storage device 26a. The reference transmittance Tstd is stored as a control parameter (constant) for each of illumination conditions (normal illumination, circular zone illumination deformed illumination small σ illumination and the like). The transmittance obtained by multiplying the reference transmittance Tstd by the aperture rate AR of the movable illumination stop 9B in FIG. 3B is expressed with a line 57 in FIG. 3C. The maximum value (value of flat portion) of the line 57 is Tstd and varied into a trapezoidal shape with respect to a position Y (Y0≧Y≧Y1) in the scanning direction. Since a width (slit width) of the exposure region 12W in the scanning direction is Ws, its transmittance is increased and decreased in a range of the widths Ws with respect to positions Y0 and Y1.

Next, the reticle 11 is placed on the reticle stage 15, the movable illumination stop 9B is controlled (opened and closed) as in the same manner as that when the exposure is carried out, the reticle stage 15 is driven to scan the reticle 11 in the Y-direction with respect to the illumination region 12R, the exposure controller 26 takes in the detection-signal $P_{RP}$ of the illumination amount monitor 21B and the detection signal DS of the integrator sensor 25 with a predetermined sampling rate, and the ratio of these values (=$P_{RP}$/DS) is stored in the storage section 26a as a function Tmes (Y) of a position (reticle coordinate system) in the Y-direction of the reticle stage 15. This function Tmes (Y) is smaller than the reference transmittance Tstd in the scanning direction, (Y0≧Y≧Y1) as shown with the curve 56 in FIG. 3C, and irregularly varied in correspondence with the rough/dense distribution of the device pattern. Next, in step 109, the exposure controller 26 calculates an illumination power coefficient η(Y) as a function of position Y using the following equation:

$$\eta(Y) = Tmes(Y)/Tstd \quad (6)$$

Figure 4:
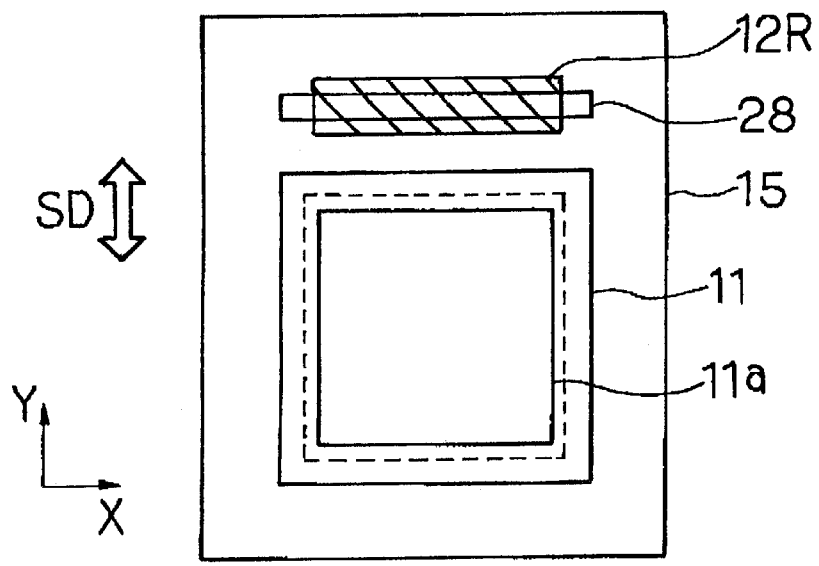
FIG. 4 is a plan view showing a reticle stage 15 shown in FIG. 1.
Figure 5:
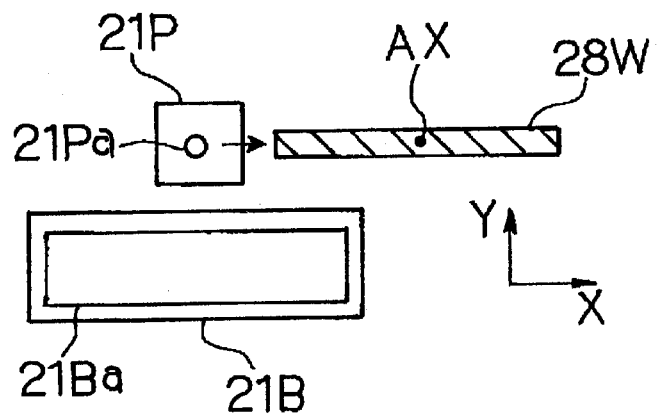
FIG. 5 is a plan view showing a state in which an image of a measuring slit is scanned by an uneven illumination sensor 21P on a wafer stage side.

Next, the flow proceeds to step 110 and the exposure controller 26 measures an initial value for starting the tracking of the transmittance variation. As an example of the measurement, a measuring slit 28 formed on the reticle stage 15 shown in FIG. 4 is used. A center of the measuring slit 28, is moved to a center of the illumination region 12R, i.e., onto the optical axis AX of the projection optical system 13 in this example, the irradiation of the pulsed illumination light IL is started and as shown in FIG. 5, and an image 28W of the measuring slit 28 is scanned in the X-direction (non-scanning direction) by the pin hole-like photoreceptor 21Pa of the uneven illumination sensor 21P on the wafer stage While moving the photoreceptor 21Pa to a series of measuring points set at predetermined distances from one another in the X-direction, a detection signal $P_{pin}$ of the uneven illumination sensor 21P and a detection signal DS of the integrator sensor 25 are taken in with the number of pulses enough to obtain sufficient reproducibility at each measuring point, and the detection signals are supplied to the computing section 26b. The computing section 26b stores (plot) the average value of value of ratio (=$P_{pin}$/DS) of the detection signals $P_{pin}$ and DS at each the measuring point as a transmittance T1(X) in the X-direction in the exposure region 12W.

Figure 6:
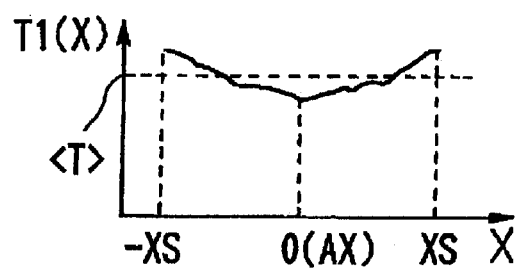
FIG. 6 is a graph showing one example of a measurement result of a transmittance distribution in a non-scanning direction of the optical system of the one embodiment of the present invention.

FIG. 6 shows the transmittance T1(X) obtained in this manner. In FIG. 6, the axis of abscissa shows X coordinate of the set exposure region 12W, and the axis of ordinate shows the transmittance T1(X) of an optical system excluding the reticle 11 in on the X coordinate, i.e., mainly the projection optical system 13 itself. FIG. 6 shows a case in which a width of the exposure region 12W in the non-scanning direction is set to a maximum value and arrange of the X coordinate is set to (−XS~+XS). Depending upon a pattern to be transferred, the range of the X coordinate in the non-scanning direction may be a predetermined region within the (−XS~+XS).

Next, the average value of the transmittance T1 in the X-direction is obtained as an average transmittance <T>, and this average transmittance <T> is stored in the storage section 26a.

Next, in step 111, the tracking of the transmittance forecasting is started. That is, the variation ratio δT(t) of the transmittance T of the optical system from the beam splitter 7 to the wafer 14 at some point in time is calculated by the computing section 26b using the following equation:

$$\delta T(t) = \delta T(t-\Delta t) \cdot \exp(-\Delta t / \tau a) + Ca \cdot W(t) \cdot [1 - \exp(-\Delta t / \tau a)] \quad (7)$$

When the tracking of the equation (7) is started, it is necessary to substitute the following equation as an initial value of the variation ratio δT(t) using the above-mentioned average transmittance <T> and the reference transmittance Tstd:

$$\delta T(t-\Delta t) = <T>/Tstd - 1 \quad (7A)$$

Here, a first term of the equation (7) is an relaxation term, a second term is an illumination term, and meanings of variables are as follows:

1) Δt; sampling time. This is sufficiently smaller than the actual exposure time, and is about some milliseconds for example.
2) τa: time constant of the transmittance variation. This is a constant which is previously obtained for each of exposure processes (a kind or kinds of reticle pattern, a mixing ratio of the kinds, setting of the stationary illumination stop 9A, an illumination condition and a density of pulse energy (fluence) at the time of exposure).
3) Ca: variation ratio [%/W] of the transmittance which is a constant which is previously obtained for each of the exposure processes.

Further, the function W(t) ("illumination power", hereinafter) in the equation (7) can be expressed with the following equation:

$$W(t) = \frac{\int_{t'=t-\Delta t}^{t'=t} \{\eta(Y) \cdot I(t') \cdot \alpha(t' - \Delta t) dt'\}}{\Delta t} \quad (8)$$

The illumination power coefficient η(Y) in this equation is a function of a position Y in the scanning direction. The position Y can be expressed with a predetermined function f(t) of a time point "t" after the tracking of transmittance estimation is started. That is, the Y coordinate of the reticle stage 15 is read every Δt during the scanning and exposure, the η(Y) is calculated in accordance with the equation (6), and by substituting the result in the equation (8), the illumination power W(t) can be obtained. Other parameters in the equation (8) are defined as follows:

I(t'): output of the integrator sensor 25 at a time point t'.

α(t'−Δt): a value of a correlation coefficient α(t) obtained by dividing pulse energy on an image plane by output of the integrator sensor 25 at a time point which is Δt before the time point t'.

The computing section 26b calculates the illumination power W(t) every Δt, substitutes the W(t) into the equation (7) to calculate the variation ratio δT (t) of the transmittance.

At the time of exposure, the correlation coefficient αa(t) is renewed every shot time or whenever Δt is elapsed. That is, the variation ratio δT(t) of the transmittance of the equation (7) and an initial value $\alpha_0$ of the correlation coefficient α(t) measured in a state in which there is no influence of illumination heat caused by exposure light before the exposure is started and a temperature is constant are used, a value of the following equation is used as the correlation coefficient α(t):

$$\alpha(t) = (1 - \delta t(t)) \cdot \alpha_0 \quad (9)$$

Figure 11:
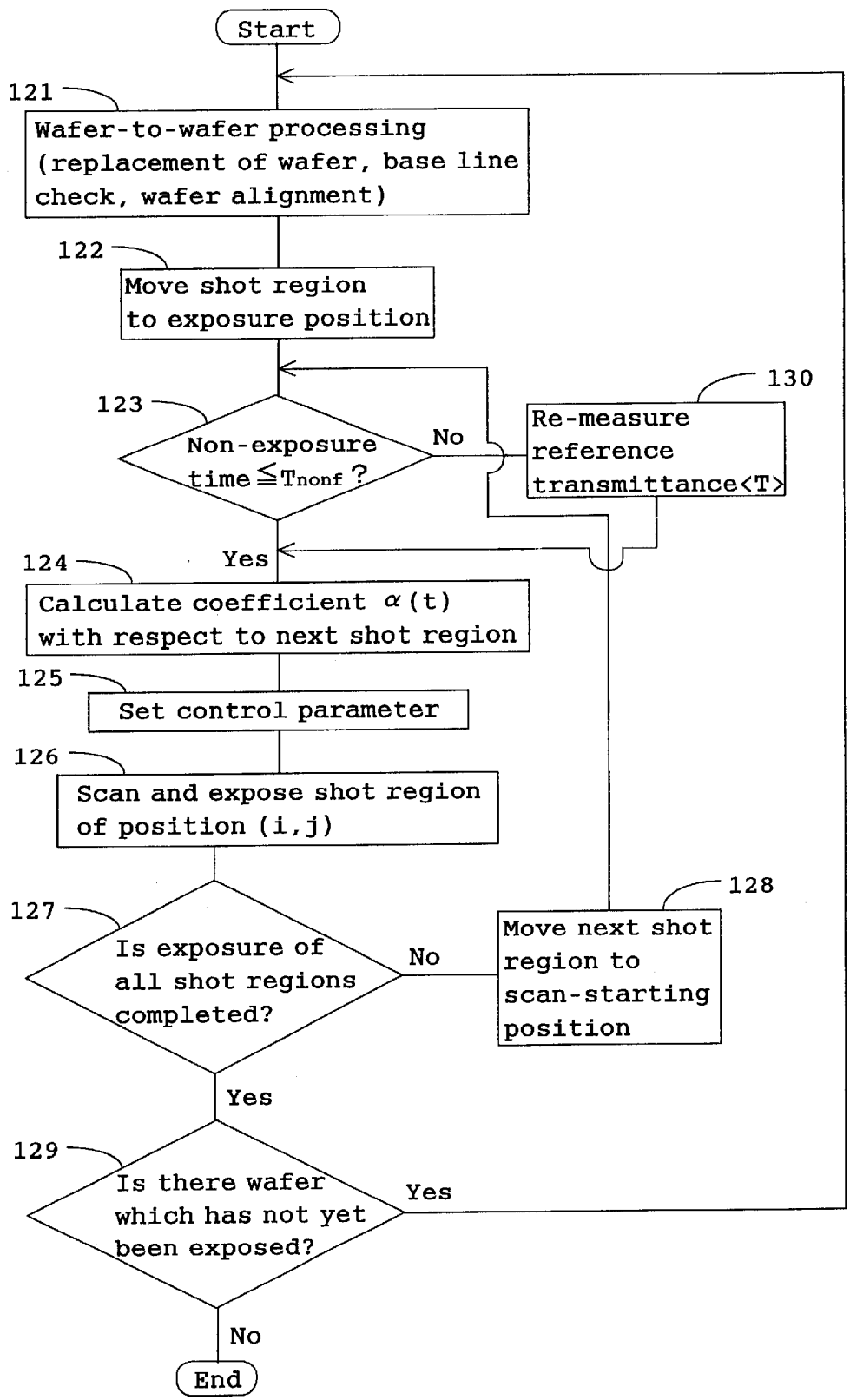
FIG. 11 is a flowchart showing a control operation of the exposure amount when scanning exposure is carried out in one example of the one embodiment.

Next, the exposure operation shown in FIG. 11 is carried out. That is, in the wafer-to-wafer processing of step 121 in FIG. 11, a wafer on the Z-tilt stage 19 shown in FIG. 1 is replaced by another wafer, a base line amount is measured by an alignment sensor (not shown), and the replaced wafer (which is defined as a wafer 14) is aligned by an enhanced global alignment (EGA) method. Then, in step 122, a shot region (chip) of the wafer 14 to be exposed is moved to a scanning starting position. In step 123, it is judged whether a non-light-emitting time of exposure light, or a time elapsed after the reference transmittance was measured is equal to or shorter than a predetermined time $T_{nonf}$ (e.g, 30 seconds). If the non-light-emitting time or the elapsed time is longer than $T_{nonf}$, the flow proceeds to step 130, and the average transmittance <T> as the reference transmittance is measured as shown in FIG. 6 as in the same manner as that in step 110. The equation (7A) is substituted as the initial value δT(t−Δt) of the variation ratio of the transmittance like the tracking-starting operation of the variation ratio of the transmittance in step 111. Thereafter, the flow proceeds to step 124.

On the other hand, the non-light-emitting time or the elapsed time is equal to or shorter than $T_{nonf}$ in step 123, the flow proceeds to step 124, the variation ratio δT(t) of the transmittance immediately before the exposure is started is reflected in the next shot exposure.

That is, a variation ratio δT(t−Δt) of the transmittance calculated at the previous time point (or as reset processing) is substituted in the equation (7), and the variation ratio δT(t) of the transmittance at the current time point "t" is calculated. Then, this variation ratio δT(t) is substituted in the equation (9) to calculate correlation coefficient α(t).

In next step 125, the exposure controller 26 determines scanning and exposure conditions of the next shot on the wafer, i.e., a set exposure amount S0, the number N of exposure pulses per one point on the wafer, light-emitting frequency "f" of the excimer laser light source 1, a set value Et of target pulse energy with the excimer laser light source 1, scanning speed V of the wafer and a set value $T_{adj}$ of the transmittance of the energy coarsely-adjuster 3. At that time, the target pulse energy Et during exposure of the next shot region (chip) can be expressed with the following equation using the number N of Exposure pulses per calculative one point and real time correlation coefficient α(t) in equation (9):

$$Et = (S0/N)/\alpha(t) \tag{10}$$

As shown in FIG. 7, if the wafer 14 is exposed by relatively moving the exposure region 12W with respect to the wafer 14 along a locus 30 (actually, the wafer 14 is moved), the shot regions are scanned and exposed in the order of shot regions 31 (2, 1), 31(3, 1), . . . . Thereupon, the exposure controller 26 sets the scanning and exposure conditions with respect to the shot region at a position (i, j) where the next exposure is to be carried out on the wafer 14 in the excimer laser light source 1 and the stage controller 17. At an initial stage of the exposing operation, the target pulse energy Et and the actual measured value Et' by the energy monitor 1c in the excimer laser light source 1 are compared with each other at each pulse, and a difference found by the comparison is fed back to a laser resonator 1a, thereby controlling the pulse energy.

Thereafter, instep 126, pulsed light emission of the excimer laser light source 1 is started. As shown in FIG. 7, the wafer 14 is scanned at a scanning speed V in the scanning direction SD (Y-direction) with respect to the exposure region 12W, thereby scanning and exposure of the shot region are carried out. One example of the exposure amount control is as follows.

That is, the exposure controller 26 shown in FIG. 1 resets a pulse counter comprising an internal register for counting the number "n" of light emission pulses before the pulsed light-emission of the excimer laser light source 1 is started. Then, the reticle 11 and the wafer 14 are scanned with constant speed in synchronism with each other. After an end of the shot region on the wafer 14 to be exposed reached a point (light emission starting point) immediately before the exposure region 12W, the exposure controller 26 allows the excimer laser light source 1 to start the pulsed light emission. Whenever the pulsed light is emitted, the exposure controller 26 measures the pulse energy of the pulsed illumination light IL through the integrator sensor 25.

In this example, the excimer laser light source 1 emits pulsed light under such a feedback control that the integrated energy per pulse of pulses having the same pulse number as that of arbitrary continuous minimum exposure pulse number ($N_{min}$) with respect to the sequentially emitted pulse illumination light become $Et \times N_{min}$ which is a constant value.

For this purpose, pulse energy measured through the integrator sensor 25 when the i-th pulse (i=0, 1, 2, . . . ) is emitted is defined as $P_i$. $P_0$ is set to be 0, that is $P_0=0$. Using pulse energy $P_i$ measured heretofore the exposure controller 26 calculate a target value of pulse energy when the next pulse is emitted in the following manner, and this target value is set in the excimer laser light source 1.

Figure 9:
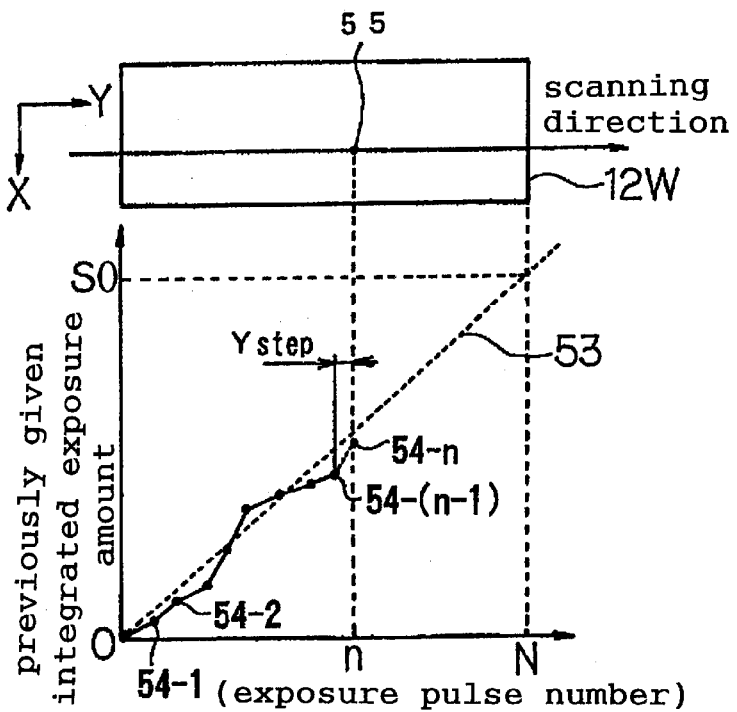
FIG. 9 is an explanatory view of a calculation method of a target pulse energy when a certain point on the wafer is exposed with n-th pulse of light.

In this case, as shown in FIG. 9, it is assumed that a point 55 on the wafer 14 has been exposed with (n−1) pulses, and the point 55 is waiting for the n-th pulse exposure. In FIG. 9; a width of the rectangular exposure region 12W in the non-scanning, direction (X-direction) is expressed narrower for the sake of convenience of explanation, and the scanning direction of the wafer 14 with respect to the exposure region 12W is+Y-direction. Points 54-1 to 54-(n−1) of a solid line in FIG. 9 express integrated exposure amounts given while the point 55 moves with respect to the exposure, region 12W. In FIG. 9, the axis of abscissa corresponds to the Y coordinate of the point 55 when each exposure pulse is irradiated. A dotted straight line 53 indicates a target integrated exposure amount when each pulse of light is emitted.

It is an object of the exposure amount control to bring the integrated exposure amount with respect to the point 55 into conformance with a set exposure amount S0 within a predetermined tolerance by N-th pulse exposure.

At that time, if a value obtained by converting pulse energy $P_i$ measured through the integrator sensor 25 at the i-th pulse into a measured value by the energy monitor 1c is defined as $E_i$ ($=\alpha 2 \times P_i$), as the simplest method, a target exposure amount Et(n) of the next -pulse for the point 55 which is waiting for n-th pulse exposure may be set as in the following manner:

$$Et(n) = Et \cdot N_{\min} - \sum_{i=n-(N\min-1)}^{n-1} Ei = Et - \sum_{i=n-(N\min-1)}^{n-1} (Ei - Et) \tag{11}$$

The exposure controller 26 outputs the pulse energy Et(n) calculated in such a manner whenever each pulse is emitted to the excimer laser light source 1, and the excimer laser light source 1 emits light in accordance with the pulse energy.

When each pulse of light is emitted, the exposure controller 26 adds one to a value n of the internal pulse counter and then, the exposure controller 26 judges whether the shot region to be exposed passed through the exposure region 12W, i.e., whether the wafer 14 reached the exposure completed point. This judgment can be made from position information of each stage from the stage controller 17. If the wafer 14 reached the exposure completed point, the scanning is completed and the, pulsed light emission is stopped.

Further, the exposure controller 26 integrates the pulse energy measured by the integrator sensor 25 to calculate an integrated exposure amount $R_k$ (k=1, 2, . . .) on an image plane for each point of distance $Y_{step}$ of a shot region which has already been exposed.

Figure 8B:
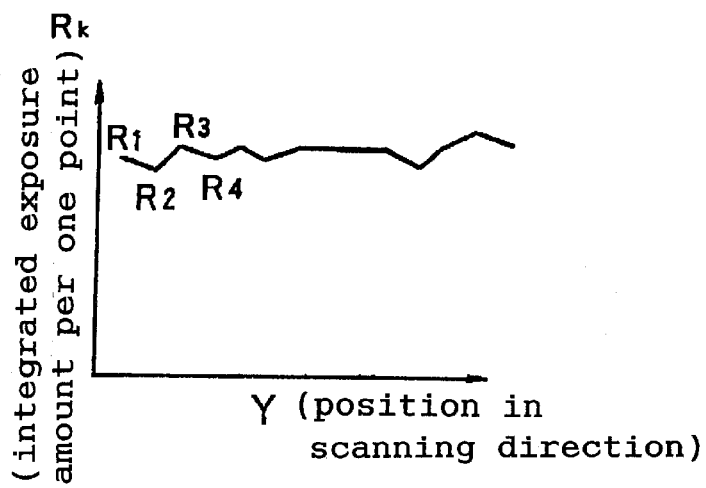
FIG. 8B is a graph showing one example of an integrated exposure amount in a plurality of series points in the shot region on the wafer.

FIG. 8B shows one example of the integrated exposure amount $R_k$ calculated every point of the shot region in this manner. The axis of abscissa of FIG. 8B indicates a position Y in the scanning direction in the shot region. At that time, the exposure controller 26 obtains an average value $R_{ave}$ a maximum value $R_{max}$ and a minimum value $R_{min}$ of the series of integrated exposure amounts $R_k$, judges whether these parameters $R_{ave}$, $R_{max}$ and $R_{min}$ are within respective tolerances, and outputs judgment results to a main control system (not shown). Then, the flow proceeds to step 127, and if there exists a shot region on the wafer 14 to be exposed next, the flow proceeds to step 128 to move the next shot region to the scanning starting position to carry out the exposure operations in steps 123 to 127.

Thereafter, when exposure of all the shot regions is completed, the flow proceeds to step 129 from step 17, and it is judged whether there exists a wafer which has not been exposed in the same lot. When there exits a wafer which has not yet been exposed, the operations in steps 121 to 128 are repeated, and when there is no more wafer to be exposed, the exposure operation is completed. The exposed wafer is put through a developing step, a pattern forming step such as etching and a resist stripping step and the like predetermined times, and is further put through a dicing step, a bonding step, a packaging step and the like, and a semiconductor device is produced.

According to this example as described above, the variation ratio δT(t) of transmittance of the optical system including the projection optical system 13 from the beam splitter 7 to the wafer 14, caused by illumination of pulsed illumination light IL and stopping the illumination is calculated, and the pulse energy of the excimer laser light source 1 is corrected using this variation ratio. Therefore, even if the transmittance of the quartz glass in the optical system is varied in the short term, it is possible to keep the integrated exposure amount at each point in each shot region on the wafer 14 within a tolerance with respect to the set exposure amount.

In step 111, the present inventors confirmed that even if the variation ratio Ca used as a control constant and the time constant τa are obtained at initial stage, they can not be used in the subsequent procedure, and they are varied by illumination to the glass material in the medium and long terms. It is preferable to renew these control constants periodically.

In reality, the variation ratio Ca and the time constant τa are varied also dependent on the pulse energy (fluence) on the image plane, the illumination power coefficient η(Y) of the equation (6) and the transmittance distribution of reticle. Thereupon, in order to further enhance the exposure amount control precision, it is preferable to renew also the variation ratio Ca and the time constant τa during exposure. For this purpose, concretely, in the step 103 in FIG. 10, when the average pulse energy P on the image plane has been calculated, the computing section 26b renews the previous time constant τa of the transmittance variation and the variation ratio Ca of the transmittance into a new time constant τa' and a new variation ratio Ca' in accordance with the following equation. Pstd is an image plane fluence measured when data of the previous time constant τa and the variation ratio Ca was obtained, and a power number k is an integer or a half-integer.

$$\tau a' = \tau a \cdot \{(Pstd/P) \cdot (1/\eta(Y))\}^k \quad (12A)$$

$$Ca' = Ca \cdot \{(Pstd/P) \cdot (1/\eta(Y))\}^k \quad (12B)$$

In this case, τa' and Ca' may be used instead of the time constant τa and the variation ratio Ca in the equation (7). The power number k is ½ (square root) for example, but in reality, the power number may be determined by experiment.

If this is generalized, using the average pulse energy P on the image plane and functions g1(P, η(Y)) and g2 (P, η(Y)) of the illumination power coefficient η(Y), the new time constant τa' and the new variation ratio Ca' can be expressed as follows:

$$\tau a' = \tau a \cdot g1(P, \eta(Y)) \quad (13A)$$

$$Ca' = Ca \cdot g2(P, \eta(Y)) \quad (13B)$$

Alternatively, the new time constant τa' and the new variation ratio Ca' may be stored as a table with respect to the average pulse energy P and the illumination power coefficient η(Y).

Further, in the above-described forecasting control of the variation ratio of the transmittance, it has been found by the inventor's experiment that the forecasting precision is deteriorated immediately after the wafer-to-wafer processing. For example, the forecasting precision is deteriorated when some shot regions are exposed immediately after the non-light emitting time was continued for a relatively long time such as the position measuring of the alignment mark as the wafer-to-wafer processing. In view of such a circumstances, in this example, in step 123, when a shot region is exposed immediately after the non-light emitting time has been continued longer than a predetermined time $T_{nonp}$, the flow proceeds to step 130, the reference transmittance is actually measured, and the variation amount of the actually measured value is used in accordance with the equation (7A) to reset the tracking. With this operation it is possible to prevent the forecasting precision of the transmittance from being deteriorated.

Another example of the exposure amount control operation in step 126 in FIG. 11 will be explained.

In this example, the excimer laser light source 1 emits the pulsed light under such a feedback control that the integrated energy per a predetermined unit pulse number becomes constant. That is, if a time during which light emission of a predetermined light emission pulse number $N_{unit}$ smaller than the minimum exposure pulse number $N_{min}$ is carried out is defined as a unit time $T_{unit}$ (this is varied by the light emission frequency fk), the excimer laser light source 1 locks power in the initial state such that an energy integrated value measured by the energy monitor 1c of pulsed light which is output every unit time $T_{unit}$ becomes $Et \times N_{unit}$. However, only with this control, there is an adverse possibility that the integrated exposure amount on the wafer is deviated from the set exposure amount S0 by the pulse energy variation and the drift. Therefore, pulse energy to be emitted by the excimer laser light source 1 next is adjusted such that the difference in pulse energy is compensated based on the measured value of the integrator sensor 25.

In this case, pulse energy measured through the integrator sensor 25 when the i-th pulse (i=0, 1, 2, . . . ) is emitted is defined as $P_i$ ($P_0$=0). The exposure controller 26 calculates a target value of pulse energy when next pulse is emitted as in the following manner using the pulse energy $P_i$ measured up to this time, and this target value is set in the excimer laser light source 1.

In this case also, as shown in FIG. 9A, it is assumed that the point 55 on the wafer 14 has been exposed with (n−1) pulses up to this time, and the point 55 is waiting for exposure of the n-th pulse. The control of the pulse energy at that time is carried out while assuming that $N_{unit}$ number of light emission pulses is a unit. The points 54-1 to 54-(n−1) of solid lines in FIG. 9B express integrated exposure amounts given while the point 55 moves with respect to the exposure region 12W. The dotted straight line 53 indicates a target integrated exposure amount when each pulse of light is emitted. It is an object of the exposure amount control to bring the integrated exposure amount with respect to the point 55 into conformance with the set exposure amount S0 within a predetermined tolerance by the N-th pulse exposure.

In this case, if a value obtained by converting pulse energy $P_i$ measured through the integrator sensor 25 at the i-th pulse into a measured value at the energy monitor 1c is defined as $E_i (=\alpha 2 \times P_i)$, a target exposure amount Et(n) of the next pulse for the point 55 which is waiting for the n-th pulse exposure is set in the following manner using predetermined weight rates (weight) $W_A$, $W_B$ [nondimensional]:

$$Et(n) = Et - W_A(E_{n-1} - Et) - W_a \sum_{i=n-1-N_{unit}}^{n-1} (Ei - Et) \quad (14)$$

The second term on the right side of this equation (14) is an error compensation term of the immediately preceding pulse obtained by multiplying an error ($E_{n-1}$−Et) of the immediately preceding pulse by the weight rate $W_A$, and the third term on the right side of the equation (14) is an error compensation term obtained by multiplying an integrated value of the error in the pulse energy of the preceding $N_{unit}$ pulses. That is, in this example, based on an error in energy of the immediately preceding pulse and an error of the previous $N_{unit}$ pulses, the control is carried out such that energy of the next pulse approaches the target value Et as close as possible, and the control precision can be optimized by the ratio of the two weight rates $W_A$ and $W_B$. The exposure controller 26 outputs the pulse energy Et(n) calculated in this manner whenever the pulsed light is emitted, and the excimer laser light, source 1 emits light in accordance therewith. A subsequent operation is the same as that of the previous embodiment.

Next, a so-called double exposure method is used recently. In this method, different reticles are exposed using two different illumination conditions alternately, and each sectioned shot region (each chip) on a wafer is exposed. When the double exposure method is applied to the above embodiment, at the beginning processing of one lot, initial values of control parameters (control constants) of steps 107 to 110 for each of illumination conditions are measured and stored in the storage section 26a. A tracking of the variation ratio δT(t) of the transmittance of the optical system is carried out using the following equation, instead of the equation (7), in which the variation amount of the transmittance is regarded being linearly with respect to time.

At that time, a previous illumination condition which is not being used is defined as the (i–1)-th illumination condition, a current illumination condition which is being used is defined as the i-th illumination condition, a variation ratio Ca under the i-th illumination condition is defined as $Ca_i$, and a time constant τa is defined as $\tau a_i$. Based on the definitions, the variation ratio can be handled as a linear system as shown in the following equation:

$$\delta T(t) = \{\delta T(t - \Delta t) \cdot \exp(-\Delta t / \tau a_{i-1}) + Ca_{i-1} \cdot 0 \cdot \qquad (15)$$
$$\{1 - \exp(-\Delta t / \tau a_{i-1})\} + \{\delta T(t - \Delta t) \cdot$$
$$\exp(-\Delta t / \tau a_i) + Ca_i \cdot W(t) \cdot$$
$$\{1 - \exp(-\Delta t / \tau a_i)\}$$
$$= \{\delta T(t - \Delta t) \cdot \exp(-\Delta t / \tau a_{i-1}) +$$
$$\{\delta T(t - \Delta t) \cdot \exp(-\Delta t / \tau a_i) +$$
$$Ca_i \cdot W(t) \cdot \{1 - \exp(-\Delta t / \tau a_i)\}$$

At that time, it has been found by experiment that in the case of the double-exposure of a combination of two illumination conditions (e.g., circular zone illumination and illumination with small σ) in which 0-dimensional light elements on a pupil plane (optical Fourier conversion surface with respect to the reticle 11) of the projection optical system 13 in FIG. 1 does no interfere with each other, forecasting precision is deteriorated even if the equation (15) is used. Therefore, when the double exposure is carried out, or whenever the illumination condition is switched, the transmittance may be measured for verification, and the initial value may be reset. Even with these countermeasures, the forecasting precision in each shot region in the wafer does not reach a predetermined level in some cases. In such a case, it is preferable to measure the transmittance for verification even before each shot region in the wafer is exposed. If a time required for switching is defined as Tc and the average illumination power under the current illumination condition is defined as $W_{PRES}$, frequency of necessary measurement is expressed with a function of Tc and $W_{PRES}$.

In the above embodiment, when the transmittance distribution in the non-scanning direction (X-direction) of the optical system is measured as shown in FIG. 6, if the variation, i.e., the variation in uneven illumination exceeds a predetermined tolerance, variation in the integrated exposure amount is increased in each point on the wafer, and there is an adverse possibility that the integrated exposure amount exceeds the tolerance with respect to the target value in some portions. Therefore, in such a case in this example, the exposure is not carried out until the transmittance is uniformed by the relaxation effect by stopping the illumination of the exposure light, or by removing the reticle to uniformly irradiate the exposure light to the projection optical system 13 to uniformizing the transmittance distribution. With this method, it is possible to prevent the error in the integrated exposure amount from exceeding the tolerance.

Although the light amount passing through the optical system including the projection optical system 13 is calculated using the integrator sensor 25 in the above embodiment, a light amount measured by the reflection amount monitor 60 shown in FIG. 3 may also be taken into consideration so as to calculate the light amount passing through the optical system more correctly.

In the above embodiment, the variation ratio of the transmittance caused by variation in transmittance of the quartz glass, but the control precision of the exposure amount can also be enhanced by applying the control method of the exposure amount of the present invention also when pulsed light having wavelength of 170 nm or less, is used as the exposure light and fluorite, magnesium fluoride ($MgF_2$) or the like is used as the refraction member, if the variation ratio of the transmittance affects the exposure amount. Further, th present invention can be applied also when the reflection ratio of the reflection member such as a mirror is varied.

In the above embodiment, the present invention is applied to a case in which the exposure is carried out using the projection exposure apparatus of a scanning exposure type using the step and scan method. The invention can also be applied when the exposure is carried out using a full field exposure type (static exposure type) exposure apparatus such as a stepper.

According to the present invention, even when an optical member whose transmittance or reflection ratio is gradually varied is used in an optical system from a measuring point of the light amount of the exposure beam to a second object, it is possible to obtain high exposure amount control precision on an object (second object such as a wafer) to be exposed.

According to the present invention, when the exposure is carried out using the pulsed light, even if the transmittance (the entire transmittance including the reflection ratio) of the optical system is gradually varied, it is possible to obtain high exposure amount control precision on the object to be exposed.

When the present invention is applied to a device producing method, since the high exposure amount control precision is obtained, it is possible to mass-produce high-performance devices having excellent line-width precision and the like.

The entire disclosure of Japanese Patent Application No. 2000-178982 filed on Jun. 14, 2000 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An exposure method which illuminates a first object with an exposure beam emitted from a light source and exposes a second object through a projection system with the exposure beam that has passed through a pattern on the first object, comprising:

obtaining a correlation between a light amount of the exposure beam detected at a measuring point on an optical path between the light source and the first object and a light amount of the exposure beam on an image plane of the projection system;

obtaining, for each exposure process condition for exposing the second object, control parameters for forecasting a variation amount of a transmittance of an optical system disposed between the measuring point and the second object;

forecasting the variation amount of the transmittance of the optical system in accordance with the obtained control parameters; and renewing the correlation based on the forecasted variation amount of the transmittance.

2. An exposure method as recited in claim 1, wherein:

a light amount of the exposure beam with respect to the second object is indirectly obtained by multiplying a detected value of the light amount of the exposure beam detected at the measuring point by a coefficient indicating the renewed correlation; and an exposure amount of the exposure beam is controlled such that the indirectly obtained light amount of the exposure beam with respect to the second object becomes a target exposure amount.

3. An exposure method as recited in claim 2, wherein the optical system includes the projection system.

4. An exposure method as recited in claim 3, wherein:

a wavelength of the exposure beam is 170 to 200 nm, and the projection system includes a refraction member made of a quartz glass.

5. An exposure method as recited in claim 4, wherein:

the projection system includes at least one refraction member made of a fluorite for correcting chromatic aberration.

6. An exposure method as recited in claim 5, wherein:

when the variation amount of the transmittance of the optical system is forecasted, at least one of an emitting time of the exposure beam and a non-emitting time of the exposure beam is considered.

7. An exposure method as recited in claim 4, wherein:

the exposure beam is a pulsed light; and the exposure process condition includes at least one of an illumination condition for the first object, a type of the pattern on the first object, a shape of an illumination region on the first object, a pulse energy of the exposure beam, and a cumulative period of use of an optical member of the optical system.

8. An exposure method as recited in claim 3, wherein:

the forecasted variation amount of the transmittance of the projection system includes a forecasted variation amount that occurred while the projection system is irradiated with the exposure beam and a forecasted variation amount that occurred while the projection system is not irradiated with the exposure beam.

9. An exposure method as recited in claim 1, wherein:

the control parameters include a variation ratio of the transmittance and a time constant of the variation of the transmittance with respect to an irradiation time of the exposure beam.

10. An exposure method as recited in claim 9, wherein:

the exposure process condition includes a plurality of illumination conditions for illuminating the first object, and the variation rate of the transmittance and the time constant are obtained for each of the plurality of illumination conditions.

11. An exposure method as recited in claim 10, wherein:

the plurality of illumination conditions include at least one of a circular zone illumination and a deformed illumination.

12. An exposure method as recited in claim 1, wherein:

when a non-emitting time of the exposure beam exceeds a predetermined time, the transmittance of the optical system is measured, and a forecasted value of the variation amount of the transmittance of the optical system is reset.

13. An exposure method as recited in claim 1, wherein:

when a predetermined time is elapsed, a transmittance distribution with respect to the exposure beam of the optical system is measured, and if a variation of the transmittance distribution exceeds a predetermined tolerance, the irradiation of the exposure beam is stopped, or an illumination region is entirely irradiated with the exposure beam.

14. A device producing method, comprising:

transferring a mask pattern onto a workpiece using the exposure method as recited in claim 1.

15. An exposure apparatus that transfers a pattern of a first object onto a second object with an exposure beam generated by an exposure light source, comprising:

an illumination system which is disposed in an optical path of the exposure beam and which irradiates the first object with the exposure beam;

a projection system which is disposed in the optical path of the exposure beam and which irradiates a second object with the exposure beam that has passed through the pattern of the first object;

a first detector which is disposed in the illumination system and which detects a light amount of the exposure beam at a measuring point in the illumination system;

a second detector which is disposed at an image plane side of the projection system and which detects a light amount of the exposure beam on the image plane of the projection system;

an exposure amount control system which is connected to the first detector and the second detector, which stores a correlation between an output of the first detector and an output of the second detector and which controls an integrated exposure amount with respect to the second object based on the output of the first detector and the correlation; and a forecasting control system which is connected to the exposure amount control system, which obtains, for each exposure process condition for exposing the second object, control parameters for forecasting a variation amount of a transmittance of an optical system disposed between the measuring point and the second object, which forecasts a variation amount of a transmittance of the projection system in accordance with the obtained control parameters, and which renews the correlation based on the forecasted variation amount of transmittance.

16. An exposure apparatus as recited in claim 15, wherein:

the exposure amount control system indirectly obtains the light amount of the exposure beam with respect to the second object by multiplying a detected value of the light amount of the exposure beam detected at the measuring point by a coefficient based on the renewed correlation, and controls the exposure amount of the exposure beam such that the indirectly obtained light amount of the exposure beam with respect to the second object becomes a target exposure amount.

17. An exposure apparatus as recited in claim 16, wherein: the optical system includes the projection system.

18. An exposure apparatus as recited in claim 17, wherein: the optical system is disposed between the measuring point and the first object and further includes a part of optical members of the illumination system.

19. An exposure apparatus as recited in claim 16, wherein: the projection system is comprised of a plurality of optical members including a refraction member made of a quartz glass and at least one refraction member made of a fluorite for correcting chromatic aberration.

20. An exposure apparatus as recited in claim 16, wherein the exposure process condition includes at least one of an illumination condition for the first object, a type of pattern on the first object, a shape of an illumination region on the first object, a pulse energy of the exposure beam, and a cumulative period of use of an optical member of the projection system.

21. An exposure apparatus as recited in claim 20, wherein: the forecasted variation amount of the transmittance of the projection system includes a forecasted variation amount that occurred while the projection system is irradiated with the exposure beam and a forecasted variation amount that occurred while the projection system is not irradiated with the exposure beam.

22. An exposure apparatus as recited in claim 21, wherein: when the variation amount of the transmittance of the projection system is forecasted, at least one of an emitting time of the exposure beam and a non-emitting time of the exposure beam is considered.

23. An exposure apparatus as recited in claim 22, wherein: the exposure process condition includes a plurality of illumination conditions for illuminating the first object, and the variation rate of the transmittance and the time constant are obtained for each of the plurality of illumination conditions.

24. An exposure apparatus as recited in claim 15, further comprising an illumination condition switching member which is provided in the illumination system and which switches illumination conditions with respect to the first object, wherein:

the forecasting control system calculates a forecasted value of the variation amount of the transmittance of the optical system in accordance with the illumination condition.

25. An exposure apparatus as recited in claim 15, further comprising a third detector which is disposed at the image plane side of the projection system and which measures a light amount distribution of the exposure beam, wherein: the third detector measures the transmittance distribution of the projection system.

26. An exposure method as recited in claim 1, wherein the control parameters include a reference transmittance, and the reference transmittance is a ratio, obtained in a state in which the first object is not disposed on the optical path of the exposure beam, of a light amount of the exposure beam detected at the measuring point to the light amount of the exposure beam on the image plane.

27. An exposure method as recited in claim 26, wherein the reference transmittance is obtained for said each exposure process condition.

28. An exposure apparatus as recited in claim 23, wherein the variation rate of the transmittance and the time constant are obtained for each of the plurality of illumination conditions.

29. An exposure apparatus as recited in claim 28, wherein the plurality of illumination conditions include at least one of a circular zone illumination and a deformed illumination.

30. An exposure apparatus as recited in claim 15, wherein the control parameters include a reference transmittance, and the reference transmittance is a ratio, obtained in a state in which the first object is not disposed on the optical path of the exposure beam, of the output of the first detector which has received the exposure beam to the output of the second detector which has received the exposure beam.

31. An exposure apparatus as recited in claim 30, wherein the reference transmittance is obtained for said each exposure process condition.

* * * * *